US012732186B2

(12) United States Patent
Rastogi et al.

(10) Patent No.: US 12,732,186 B2
(45) Date of Patent: Sep. 8, 2026

(54) METHODS, APPARATUS, AND ARTICLES OF MANUFACTURE TO MANAGE TERMINATION IMPEDANCE IN A RE-DRIVER

(71) Applicant: Texas Instruments Incorporated, Dallas, TX (US)

(72) Inventors: Srijan Rastogi, Bengaluru (IN); Douglas E. Wente, Murphy, TX (US); Mustafa U. Erdogan, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/621,547

(22) Filed: Mar. 29, 2024

(65) Prior Publication Data

US 2025/0247093 A1 Jul. 31, 2025

Related U.S. Application Data

(60) Provisional application No. 63/626,167, filed on Jan. 29, 2024.

(51) Int. Cl.
*H03K 17/00* (2006.01)
*H03K 17/687* (2006.01)
*H03K 19/20* (2006.01)

(52) U.S. Cl.
CPC ......... *H03K 17/6871* (2013.01); *H03K 19/20* (2013.01)

(58) Field of Classification Search
CPC ....... H03K 19/0175; H03K 19/017509; H03K 19/017545; H03K 19/017581;
(Continued)

(56) References Cited

U.S. PATENT DOCUMENTS 6,037,402 A * 3/2000 Asano ........................ C08J 3/21 524/544
2003/0085736 A1* 5/2003 Tinsley ................. H04L 25/028 326/81

(Continued)

OTHER PUBLICATIONS

USB3.0 Promoter Group, “Universal Serial Bus Type-C Cable and Connector Specification.” USB3.0 Promoter Group, Release 2.3, Oct. 2023, 424 pages.

*Primary Examiner* — Tuan T Lam
(74) *Attorney, Agent, or Firm* — Xianghui Huang; Frank D. Cimino

(57) ABSTRACT

An example apparatus includes a termination network having a first input terminal coupled to a first input/output terminal and a second input terminal coupled to a second input/output terminal. The apparatus includes transmitter circuitry having a first output terminal coupled to the first input/output terminal and a second output terminal coupled to the second input/output terminal. The apparatus includes receiver circuitry having a first input terminal coupled to a first output terminal of the termination network and a second input terminal coupled to a second output terminal of the termination network. The apparatus includes control circuitry coupled to a third input terminal of the termination network, the control circuitry to: change an impedance of the termination network to compensate for a transient in a common mode voltage; and based on the common mode voltage reaching a steady state value, change the impedance of the termination network for steady state operation.

25 Claims, 14 Drawing Sheets

(58) Field of Classification Search
CPC ......... H03K 19/01759; H03K 19/0185; H03K 19/018507; H03K 19/018557; H03K 19/018571; H03K 19/018585; H03K 19/018592
See application file for complete search history.

(56) References Cited

U.S. PATENT DOCUMENTS

| | | | | |
|---|---|---|---|---|
| 2003/0201799 | A1* | 10/2003 | Takauchi | H03K 5/003 326/127 |
| 2005/0253593 | A1* | 11/2005 | Bond | G01R 31/58 324/539 |
| 2016/0079942 | A1* | 3/2016 | Li | H04L 25/0272 330/261 |
| 2024/0264312 | A1* | 8/2024 | Raag | G01S 7/497 |

* cited by examiner

TO FIG. 3B

SHARED TERMINATION NETWORK

TRANSMITTER EQUALIZER CIRCUITRY

FIG. 3A 1100
1102
FAR_END_VCM
-220mV
V (mV)
0.0
-50.0
-100.0
-150.0
-200.0
1104
NEAR_END_VCM
1.25V
1106
1108
V (V)
1.8
1.7
1.6
1.5
1.4
1.3
0.0
2.5
5.0
7.5
10.0
12.5
15.0
17.5
20.0
22.5
25.0
27.5
30.0
32.5
35.0
37.5
40.0
42.5
45.0
47.5
50.0
52.5
TIME (μs)

1200

FAR_END_VCM
1202
0.81V
V (mV)
800.0
700.0
600.0
500.0
400.0
300.0
200.0
100.0
0.0
-100.0
1204
NEAR_END_VCM
1.8V
1206
1208
V (V)
1.75
1.5
1.25
1.0
0.75
0.5
0.25
0.0
TIME (μs)
0.0
5.0
10.0
15.0
20.0
25.0
30.0
35.0
40.0
45.0
50.0
55.0
60.0
65.0
70.0
75.0
80.0
85.0
90.0
95.0
100.0

METHODS, APPARATUS, AND ARTICLES OF MANUFACTURE TO MANAGE TERMINATION IMPEDANCE IN A RE-DRIVER

CROSS-REFERENCE TO RELATED APPLICATION

This patent application claims the benefit of and priority to U.S. Provisional Patent Application Ser. No. 63/626,167 filed Jan. 29, 2024, which Application is hereby incorporated herein by reference in its entirety.

TECHNICAL FIELD

This description relates generally to circuits and, more particularly, to methods, apparatus, and articles of manufacture to manage termination impedance in a re-driver.

BACKGROUND

Communication systems experience signal loss resulting from one or more transmission paths (e.g., trace, cable, connector, etc.) of the communication systems. Communication systems include re-timers and re-drivers to counteract signal loss. For example, a re-timer recovers data transmitted in a communication system, extracts an embedded clock signal from the data transmitted in the communication system, and retransmits a copy of the data utilizing a recovered clock signal (e.g., retiming the copy of the data). A re-driver amplifies high-frequency portions of a signal in a communication system to counteract frequency-dependent attenuation resulting from one or more transmission paths of the communication system.

SUMMARY

For methods, apparatus, and articles of manufacture to manage termination impedance in a re-driver, an example apparatus includes a first input/output (I/O) terminal and a second I/O terminal. The apparatus includes a first resistor having a first terminal and a second terminal, the first terminal coupled to the first input/output (I/O) terminal and a second terminal coupled to at least one of a supply voltage terminal or a ground terminal. The apparatus includes a second resistor having a first terminal coupled to the second terminal of the first resistor and a second terminal coupled to the second I/O terminal. The apparatus includes a third resistor having a first terminal and a second terminal, the first terminal of the third resistor coupled to the first I/O terminal. The apparatus includes a first switch having a control terminal, a first terminal, and a second terminal, the first terminal of the first switch coupled to the second terminal of the first resistor, the second terminal of the first switch coupled to the second terminal of the third resistor. The apparatus includes a second switch having a control terminal, a first terminal, and a second terminal, the first terminal of the second switch coupled to the first terminal of the first switch and the second terminal of the first resistor. The apparatus includes a fourth resistor having a first terminal coupled to the second terminal of the second switch and a second terminal coupled to the second I/O terminal. The apparatus includes control circuitry having an output terminal coupled to the control terminal of the first switch and the control terminal of the second switch. The apparatus includes transmitter circuitry having a first output terminal coupled to the first I/O terminal and a second output terminal coupled to the second I/O terminal. The apparatus includes receiver circuitry having a first input terminal coupled to the first I/O terminal and a second input terminal coupled to the second I/O terminal. Other examples are described.

For methods, apparatus, and articles of manufacture to manage termination impedance in a re-driver, an example apparatus includes a first input/output (I/O) terminal and a second I/O terminal. The apparatus includes a termination network having a first input terminal, a second input terminal, a third input terminal, a first output terminal, and a second output terminal, the first input terminal of the termination network coupled to the first I/O terminal, the second input terminal of the termination network coupled to the second I/O terminal. The apparatus includes transmitter circuitry having a first output terminal coupled to the first I/O terminal and a second output terminal coupled to the second I/O terminal. The apparatus includes receiver circuitry having a first input terminal coupled to the first output terminal of the termination network and a second input terminal coupled to the second output terminal of the termination network. The apparatus includes control circuitry having an output terminal coupled to the third input terminal of the termination network, the control circuitry to: change an impedance of the termination network to a first value to compensate for at least one transient in a common mode voltage of the termination network; and based on the common mode voltage reaching a steady state value, change the impedance of the termination network to a second value for steady state operation. Other examples are described.

For methods, apparatus, and articles of manufacture to manage termination impedance in a re-driver, an example includes changing, with control circuitry, an impedance of a termination network of a re-driver to a first value to compensate for at least one transient in a common mode voltage of the termination network. The method includes based on the common mode voltage reaching a steady state value, changing, with the control circuitry, the impedance of the termination network to a second value for steady state operation. Other examples are described.

BRIEF DESCRIPTION OF THE DRAWINGS

FIGS. 3A and 3B (referred to collectively as FIG. 3) are a block diagram of an example implementation of the shared termination network, the transmitter circuitry, and the receiver circuitry of FIG. 2.

The same reference numbers or other reference designators are used in the drawings to designate the same or similar (at least one of functional or structural) features.

DETAILED DESCRIPTION

Figure 1:
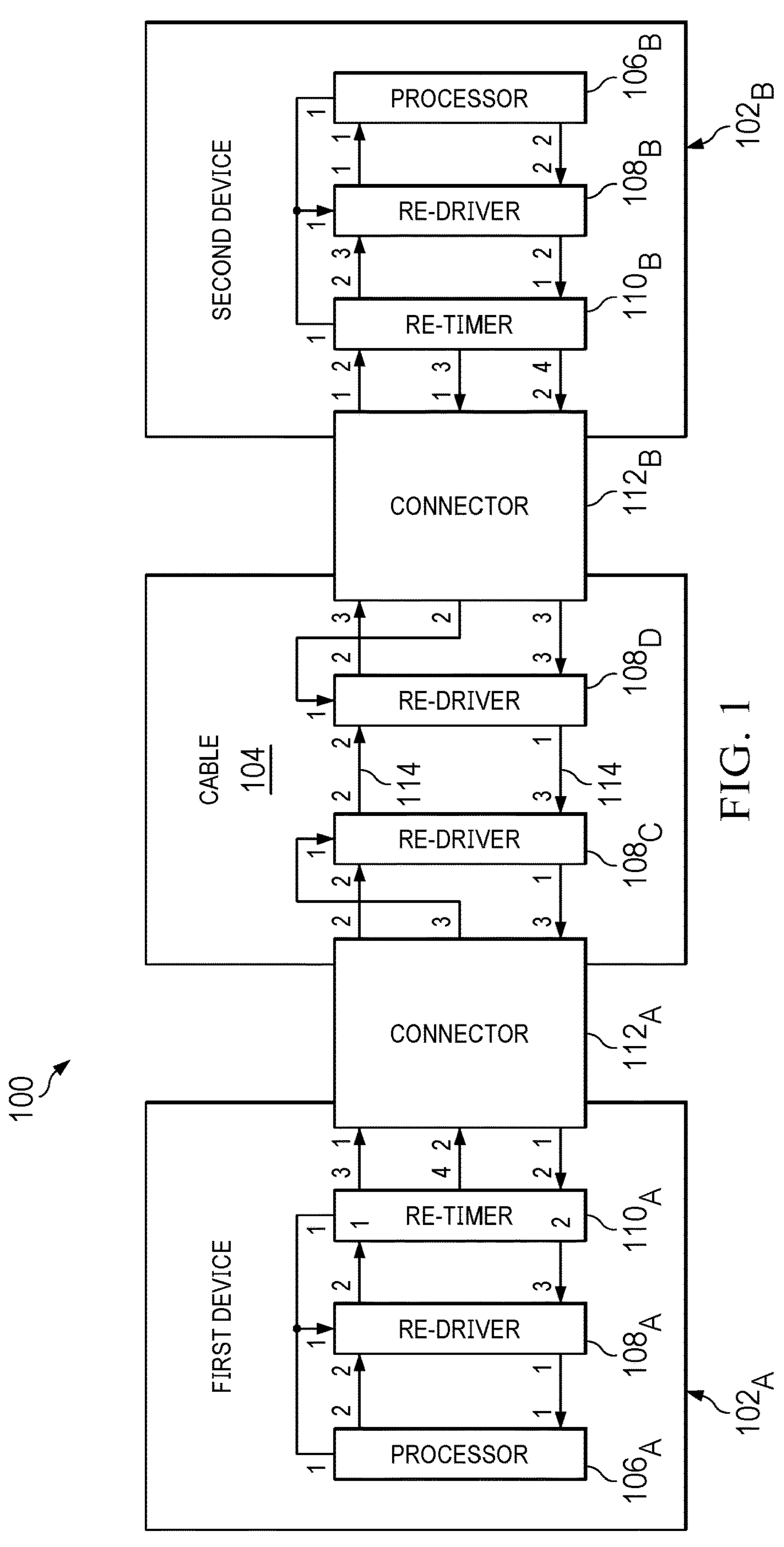
FIG. 1 is a block diagram of an example communication system including one or more re-drivers.

The drawings are not necessarily to scale. Generally, the same reference numbers in the drawing(s) and this description refer to the same or like parts. Although the drawings show regions with clean lines and boundaries, at least one of some or all of these lines or some or all of these boundaries may be idealized. In reality, at least one of the boundaries or lines may be at least one of unobservable, blended, or irregular.

Communication systems may be designed to comply with a communication protocol or a communication standard. For example, the Universal Serial Bus (USB) standard defines a specification for data exchange and delivery of power between electronic devices. The USB standard includes four generations of specifications: USB 1, USB 2, USB 3, and USB 4. The specifications for USB 3 and USB 4 (also referred to as USB 3 and USB 4) permit the termination of a re-driver to be shared between a transmitter and a receiver of the re-driver. A termination or termination network of a device is a network of electrical components that interfaces between the device and a transmission path. For example, a termination network of a device interfaces with a transmission path to match a characteristic impedance of the transmission path and reduce signal reflection at input/output (I/O) terminals of the device.

Sharing the termination network between a transmitter and a receiver of a re-driver, as permitted by USB 3 and USB 4, reduces parasitic impedance at I/O terminals of the re-driver. Also, when the termination network is shared between a transmitter and a receiver of a re-driver, the common mode terminal between the I/O terminals of the re-driver is biased to a voltage. For example, in some protocol states in USB 3 and USB 4, the common mode terminal between the I/O terminals of a re-driver is biased to 1.8 volts (V). USB 3 and USB 4 include limits on how much the voltage to which the common mode terminal between the I/O terminals (e.g., the common mode voltage) of a re-driver is biased can vary.

To maintain compliance with USB 3 and USB 4, the common mode voltage of a re-driver cannot vary outside the limits set by USB 3 and USB 4. For example, USB 3 and USB 4 specify that the common mode voltage of a re-driver cannot decrease by more than 300 millivolts (mV) (e.g., during transmitter enable) and cannot increase by more than 1 V (e.g., during receiver enable). Also, to maintain compliance with USB 3 and USB 4, a re-driver cannot trigger voltages of a device at the far end of a transmission path to vary outside the limits set by USB 3 and USB 4. In examples described herein, the near end of a transmission path is a relative term that refers to the end of the transmission path to which a first device (e.g., a re-driver) is coupled, and the far end of the transmission path is a relative term that refers to the end of the transmission path to which a second device is coupled. For example, a first end of a transmission path may be the near end of the transmission path relative to a first device and the far end of the transmission path relative to a second device.

Because the impedance of the termination network of a device at the far end of a transmission path may not be known to the developer of a re-driver, biasing the common mode voltage of the re-driver to a voltage can trigger voltages of the device at the far end of the transmission path to vary outside the limits set by USB 3 and USB 4. For example, USB 3 and USB 4 specify the impedance for the termination network of a compliant device to be 42.5 Ohms (Ω). However, biasing the common mode voltage of a re-driver to 1.8 V with a termination network having an impedance of 42.5 (can trigger the common mode voltage of a device at the far end of a transmission path to vary outside the limits specified by USB 3 and USB 4.

For example, biasing the common mode voltage of a re-driver to 1.89 V (e.g., 1.8 V with 5% variation) with a termination network having an impedance of 42.5 Ω can trigger the common mode voltage of a device at the far end of a transmission path to vary outside the limits specified by USB 3 and USB 4 by 25 mV (e.g., the common mode voltage of the device at the far end of the transmission path can increase by 1.025 V or decrease by 325 mV). With variations in process, voltage, and temperature (PVT), biasing the common mode voltage of a re-driver to 1.89 V with a termination network having an impedance of 42.5 Ω can trigger the common mode voltage of a device at the far end of a transmission path to vary outside the limits specified by USB 3 and USB 4 by as much as 200 mV. Because of these complications, re-drivers have been designed with separate termination networks for transmitters and receivers.

Examples described herein include a termination network with variable impedance that is shared between a transmitter and a receiver of a re-driver. Also, examples described herein include control circuitry to control the impedance of the shared termination network during operation of the re-driver. In some examples, described control circuitry biases a driver of a transmitter of a re-driver with a reduced current to reduce (e.g., minimize) transients in the common mode voltage of the re-driver and increases the bias current of the driver to a steady state value for nominal operation (e.g., high-speed operation, between 500 megabits (MB) per second (MB/s) and 40 gigabits (Gbits) per second (Gbits/s), up to 4.8 gigabytes (GB) per second (GB/s), between 20 Gbits/s and 120 Gbits/s, up to 14.4 GB/s, etc.) of the re-driver. In examples described herein, example control circuitry controls the impedance of the shared termination network to prevent variations in (1) the common mode voltage of the re-driver and (2) voltages of a device at the far end of a transmission path outside the limits set by USB 3 and USB 4.

For example, described control circuitry at least one of decreases the impedance of the shared termination network during enablement of transmitter circuitry of the re-driver or increases the impedance of the shared termination network during enablement of receiver circuitry of the re-driver. Also, example control circuitry adjusts the impedance of the shared termination network of a re-driver to reduce (e.g., minimize) an initial transient in the common mode voltage of the re-driver and returns the impedance of the shared termination network to a steady state value (e.g., 42.5Ω) for nominal operation (e.g., high-speed operation, between 500 MB/s and 40 Gbits/s, up to 4.8 GB/s, between 20 Gbits/s and 120 Gbits/s, up to 14.4 GB/s, etc.) of the re-driver. As such, described examples reduce (e.g., minimize) variations from the common mode voltage to maintain compliance with the limits specified by USB 3 and USB 4.

For example, when receiver circuitry of a re-driver is enabled, example control circuitry increases the impedance of the shared termination network by 20%. By doing so, example control circuitry reduces the shift in the common mode voltage of a device at the far end of a transmission path including the re-driver to 0.85 V which is within the variance permitted by USB 3 and USB 4 (e.g., 1 V). After the transient in the common mode voltage, example control circuitry returns the impedance of the shared termination network to the value specified by USB 3 and USB 4 (e.g., 42.5Ω). Also, for example, when transmitter circuitry of a re-driver is enabled, example control circuitry decreases the impedance of the shared termination network by 20%. By doing so, example control circuitry reduces (e.g., minimizes) a shift in the common mode voltage of a device at the far end of a transmission path including the re-driver to a value within the variance permitted by USB 3 and USB 4. After the transient in the common mode voltage, example control circuitry returns the impedance of the shared termination network to the value specified by USB 3 and USB 4 (e.g., 42.5Ω). As such, examples described herein maintain compliance with USB 3 and USB 4.

FIG. 1 is a block diagram of an example communication system 100 including one or more re-drivers. In the example of FIG. 1, the communication system 100 includes a first example device 102$_A$, a second example device 102$_B$, and an example cable 104. The example device 102$_A$ includes a first example processor 106$_A$, a first example re-driver 108$_A$, a first example re-timer 110$_A$, and a first example connector 112$_A$. Also, the example device 102$_B$ includes a second example processor 106$_B$, a second example re-driver 108$_B$, a second example re-timer 110$_B$, and a second example connector 112$_B$. In the example of FIG. 1, the cable 104 includes a third example re-driver 108$_C$ and a fourth example re-driver 108$_D$.

In the illustrated example of FIG. 1, the processor 106$_A$ includes a first output terminal, a second output terminal, and an input terminal. In the example of FIG. 1, the re-driver 108$_A$ includes a first input terminal, a second input terminal, a third input terminal, a first output terminal, and a second output terminal. Also, the re-timer 110$_A$ includes a first input terminal, a second input terminal, a first output terminal, a second output terminal, a third output terminal, and a fourth output terminal. In the example of FIG. 1, the connector 112$_A$ (e.g., a USB port) includes a first input terminal, a second input terminal, a third input terminal, a first output terminal, a second output terminal, and a third output terminal. Also, the re-driver 108$_C$ includes a first input terminal, a second input terminal, a third input terminal, a first output terminal, and a second output terminal.

In the illustrated example of FIG. 1, the re-driver 108$_D$ includes a first input terminal, a second input terminal, a third input terminal, a first output terminal, and a second output terminal. In the example of FIG. 1, the connector 112$_B$ (e.g., a USB port) includes a first input terminal, a second input terminal, a third input terminal, a first output terminal, a second output terminal, and a third output terminal. Also, the re-timer 110$_B$ includes a first input terminal, a second input terminal, a first output terminal, a second output terminal, a third output terminal, and a fourth output terminal. In the example of FIG. 1, the re-driver 108$_B$ includes a first input terminal, a second input terminal, a third input terminal, a first output terminal, and a second output terminal. Also, the processor 106$_B$ includes a first output terminal, a second output terminal, and an input terminal.

In the illustrated example of FIG. 1, the input terminal of the processor 106$_A$ is coupled to the first output terminal of the re-driver 108$_A$ (e.g., via a printed circuit board (PCB) trace). Also, the first output terminal of the processor 106$_A$ is coupled to the first input terminal of the re-driver 108$_A$. In the example of FIG. 1, the second output terminal of the processor 106$_A$ is coupled to the second input terminal of the re-driver 108$_A$ (e.g., via a PCB trace).

In the illustrated example of FIG. 1, the first input terminal of the re-driver 108$_A$ is coupled to the first output terminal of the processor 106$_A$ and the first output terminal of the re-timer 110$_A$. Also, the second input terminal of the re-driver 108$_A$ is coupled to the second output terminal of the processor 106$_A$ (e.g., via a PCB trace). In the example of FIG. 1, the third input terminal of the re-driver 108$_A$ is coupled to the second output terminal of the re-timer 110$_A$ (e.g., via a PCB trace). Also, the first output terminal of the re-driver 108$_A$ is coupled to the input terminal of the processor 106$_A$ (e.g., via a PCB trace). In the example of FIG. 1, the second output terminal of the re-driver 108$_A$ is coupled to the first input terminal of the re-timer 110$_A$ (e.g., via a PCB trace).

In the illustrated example of FIG. 1, the first input terminal of the re-timer 110$_A$ is coupled to the second output terminal of the re-driver 108$_A$ (e.g., via a PCB trace). Also, the second input terminal of the re-timer 110$_A$ is coupled to the first output terminal of the connector 112$_A$. In the example of FIG. 1, the first output terminal of the re-timer 110$_A$ is coupled to the first input terminal of the re-driver 108$_A$. Also, the second output terminal of the re-timer 110$_A$ is coupled to the third input terminal of the re-driver 108$_A$ (e.g., via a PCB trace). In the example of FIG. 1, the third output terminal of the re-timer 110$_A$ is coupled to the first input terminal of the connector 112$_A$. Also, the fourth output terminal of the re-timer 110$_A$ is coupled to second input terminal of the connector 112$_A$.

In the illustrated example of FIG. 1, the first input terminal of the connector 112$_A$ is coupled to the third output terminal of the re-timer 110$_A$. Also, the second input terminal of the connector 112$_A$ is coupled to the fourth output terminal of the re-timer 110$_A$. In the example of FIG. 1, the third input terminal of the connector 112$_A$ is coupled to the first output terminal of the re-driver 108$_C$. Also, the first output terminal of the connector $112_A$ is coupled to the second input terminal of the re-timer $110_A$. In the example of FIG. 1, the second output terminal of the connector $112_A$ is coupled to the second input terminal of the re-driver $108_C$. Also, the third output terminal of the connector $112_A$ is coupled to the first input terminal of the re-driver $108_C$.

In the illustrated example of FIG. 1, the first input terminal of the re-driver $108_C$ is coupled to the third output terminal of the connector $112_A$. Also, the second input terminal of the re-driver $108_C$ is coupled to the second output terminal of the connector $112_A$. In the example of FIG. 1, the re-driver $108_C$ and the re-driver $108_D$ are coupled via example cable transmission paths 114. For example, the third input terminal of the re-driver $108_C$ is coupled to the first output terminal of the re-driver $108_D$ (e.g., via at least one of the cable transmission paths 114). Also, the first output terminal of the re-driver $108_C$ is coupled to the third input terminal of the connector $112_A$. In the example of FIG. 1, the second output terminal of the re-driver $108_C$ is coupled to the second input terminal of the re-driver $108_D$ (e.g., via at least one of the cable transmission paths 114).

In the illustrated example of FIG. 1, the first input terminal of the re-driver $108_D$ is coupled to the second output terminal of the connector $112_B$. Also, the second input terminal of the re-driver $108_D$ is coupled to the second output terminal of the re-driver $108_C$ (e.g., via at least one of the cable transmission paths 114). In the example of FIG. 1, the third input terminal of the re-driver $108_D$ is coupled to the third output terminal of the connector $112_B$. Also, the first output terminal of the re-driver $108_D$ is coupled to the third input terminal of the re-driver $108_C$ (e.g., via at least one of the cable transmission paths 114). In the example of FIG. 1, the second output terminal of the re-driver $108_D$ is coupled to the third input terminal of the connector $112_B$.

In the illustrated example of FIG. 1, the first input terminal of the connector $112_B$ is coupled to the third output terminal of the re-timer $110_B$. Also, the second input terminal of the connector 112 is coupled to the fourth output terminal of the re-timer $110_B$. In the example of FIG. 1, the third input terminal of the connector $112_B$ is coupled to the second output terminal of the re-driver $108_D$. Also, the first output terminal of the connector $112_B$ is coupled to the second input terminal of the re-timer $110_B$. In the example of FIG. 1, the second output terminal of the connector $112_B$ is coupled to the first input terminal of the re-driver $108_D$. Also, the third output terminal of the connector $112_B$ is coupled to the third input terminal of the re-driver $108_D$.

In the illustrated example of FIG. 1, the first input terminal of the re-timer $110_B$ is coupled to the second output terminal of the re-driver $108_B$ (e.g., via a PCB trace). Also, the second input terminal of the re-timer $110_B$ is coupled to the first output terminal of the connector $112_B$. In the example of FIG. 1, the first output terminal of the re-timer $110_B$ is coupled to the first input terminal of the re-driver $108_B$. Also, the second output terminal of the re-timer $110_B$ is coupled to the third input terminal of the re-driver $108_B$ (e.g., via a PCB trace). In the example of FIG. 1, the third output terminal of the re-timer $110_B$ is coupled to the first input terminal of the connector $112_B$. Also, the fourth output terminal of the re-timer $110_B$ is coupled to second input terminal of the connector $112_B$.

In the illustrated example of FIG. 1, the first input terminal of the re-driver $108_B$ is coupled to the first output terminal of the processor $106_B$ and the first output terminal of the re-timer $110_B$. Also, the second input terminal of the re-driver $108_B$ is coupled to the second output terminal of the processor $106_B$ (e.g., via a PCB trace). In the example of FIG. 1, the third input terminal of the re-driver $108_B$ is coupled to the second output terminal of the re-timer $110_B$ (e.g., via a PCB trace). Also, the first output terminal of the re-driver $108_B$ is coupled to the input terminal of the processor $106_B$ (e.g., via a PCB trace). In the example of FIG. 1, the second output terminal of the re-driver $108_B$ is coupled to the first input terminal of the re-timer $110_B$ (e.g., via a PCB trace).

In the illustrated example of FIG. 1, the input terminal of the processor $106_B$ is coupled to the first output terminal of the re-driver $108_B$ (e.g., via a PCB trace). Also, the first output terminal of the processor $106_B$ is coupled to the first input terminal of the re-driver $108_B$. In the example of FIG. 1, the second output terminal of the processor $106_B$ is coupled to the second input terminal of the re-driver $108_B$ (e.g., via a PCB trace).

In the illustrated example of FIG. 1, each of the processor $106_A$ and the processor $106_B$ is implemented by an integrated circuit. In the example of FIG. 1, the processor $106_A$ and the processor $106_B$ are in communication over transmission paths of the communication system 100. In the example of FIG. 1, some transmission paths of the communication system 100 are lossy. For example, PCB traces and the cable transmission paths 114 of the communication system 100 are lossy.

In the illustrated example of FIG. 1, the cable 104 includes the re-driver $108_C$, the re-driver $108_D$, and the cable transmission paths 114. In the example of FIG. 1, the cable transmission paths 114 couple the re-driver $108_C$ to the re-driver $108_D$. For example, the cable transmission paths 114 have a length between two and three meters. Also, for example, under the American Wire Gauge (AWG), the cable transmission paths 114 have a gauge between 26 and 34. Also or alternatively, the cable transmission paths 114 can be any length or gauge.

In the illustrated example of FIG. 1, each of the re-driver $108_A$, the re-driver $108_B$, the re-driver $108_C$, and the re-driver $108_D$ is implemented by an integrated circuit. In the example of FIG. 1, the re-driver $108_A$ and the re-driver $108_B$ amplify high-frequency portions of signals in the communication system 100 to equalize signal loss resulting from PCB traces of the communication system 100. Also, the re-driver $108_C$ and the re-driver $108_D$ amplify high-frequency portions of signals in the communication system 100 to equalize signal loss resulting from the cable transmission paths 114 of the communication system 100.

In the illustrated example of FIG. 1, each of the re-timer $110_A$ and the re-timer $110_B$ is implemented by an integrated circuit. In the example of FIG. 1, the re-timer $110_A$ and the re-timer $110_B$ recover data transmitted in the communication system 100. Also, the re-timer $110_A$ and the re-timer $110_B$ extract embedded clock signal(s) from the data transmitted in the communication system 100 and retransmit copy(ies) of the data utilizing the recovered clock signal(s).

Figure 2:
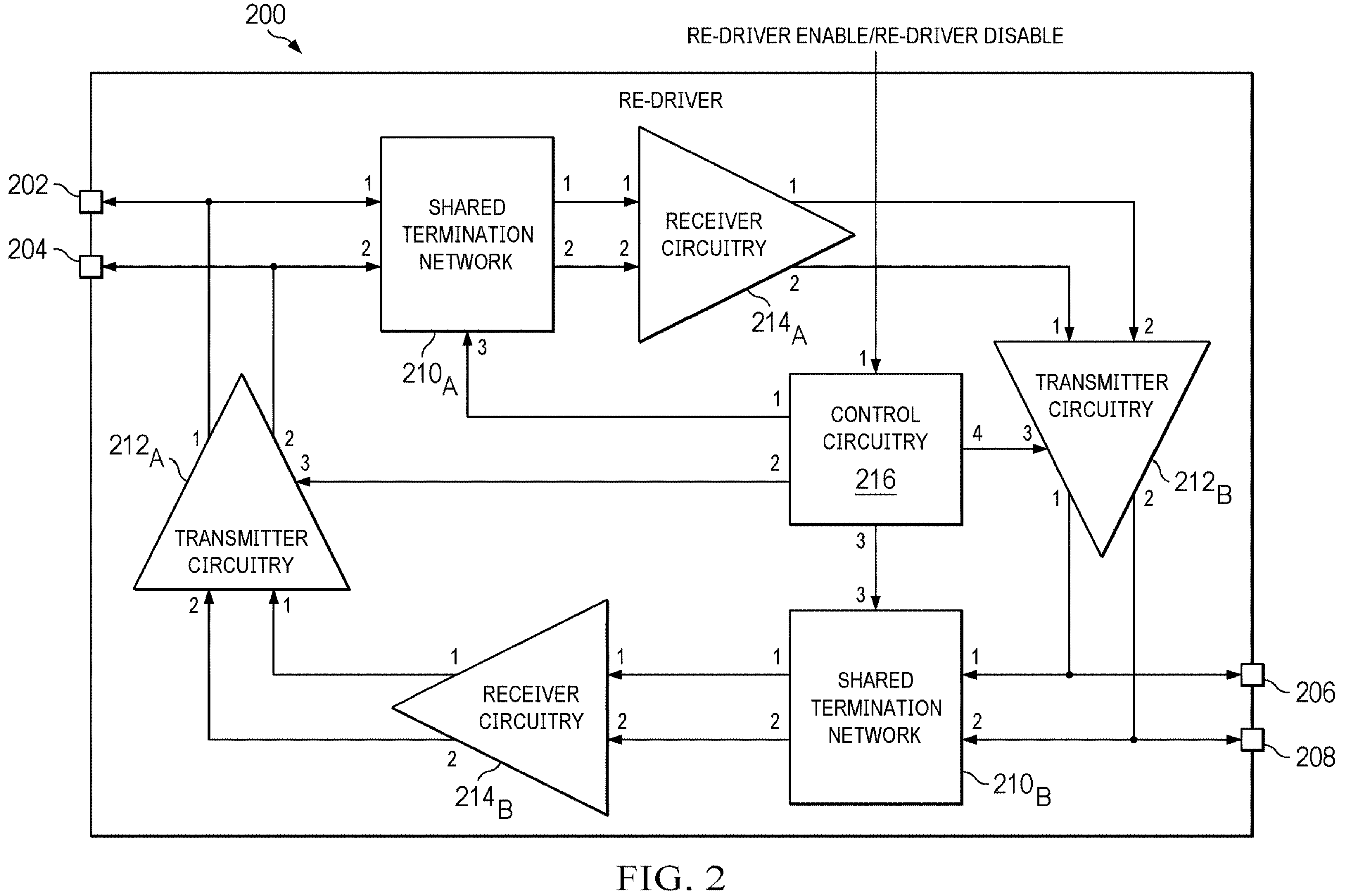
FIG. 2 is a block diagram of an example re-driver to implement one or more of the re-drivers of FIG. 1.

FIG. 2 is a block diagram of an example re-driver 200 to implement one or more of the re-drivers $108_A$, $108_B$, $108_C$, $108_D$ of FIG. 1. In the example of FIG. 2, the re-driver 200 includes a first example input/output (I/O) terminal 202, a second example input/output (I/O) terminal 204, a third example input/output (I/O) terminal 206, and a fourth example input/output (I/O) terminal 208. Also, the re-driver 200 includes a first example shared termination network $210_A$, first example transmitter circuitry $212_A$, first example receiver circuitry $214_A$, a second example shared termination network $210_B$, second example transmitter circuitry $212_B$, second example receiver circuitry $214_B$, and control circuitry 216.

In the illustrated example of FIG. 2, the shared termination network 210$_A$ includes a first input terminal, a second input terminal, a third input terminal, a first output terminal, and a second output terminal. Also, the transmitter circuitry 212$_A$ includes a first input terminal, a second input terminal, a third input terminal, a first output terminal, and a second output terminal. In the example of FIG. 2, the receiver circuitry 214$_A$ includes a first input terminal, a second input terminal, a first output terminal, and a second output terminal.

In the illustrated example of FIG. 2, the shared termination network 210$_B$ includes a first input terminal, a second input terminal, a third input terminal, a first output terminal, and a second output terminal. Also, the transmitter circuitry 212$_B$ includes a first input terminal, a second input terminal, a third input terminal, a first output terminal, and a second output terminal. In the example of FIG. 2, the receiver circuitry 214$_B$ includes a first input terminal, a second input terminal, a first output terminal, and a second output terminal. Also, the control circuitry 216 includes an input terminal, a first output terminal, a second output terminal, a third output terminal, and a fourth output terminal.

In the illustrated example of FIG. 2, the first input terminal of the shared termination network 210$_A$ is coupled to the first I/O terminal 202. Also, the second input terminal of the shared termination network 210$_A$ is coupled to the second I/O terminal 204. In the example of FIG. 2, the third input terminal of the shared termination network 210$_A$ is coupled to the first output terminal of the control circuitry 216. Also, the first output terminal of the shared termination network 210$_A$ is coupled to the first input terminal of the receiver circuitry 214$_A$. In the example of FIG. 2, the second output terminal of the shared termination network 210$_A$ is coupled to the second input terminal of the receiver circuitry 214$_A$.

In the illustrated example of FIG. 2, the first input terminal of the transmitter circuitry 212$_A$ is coupled to the first output terminal of the receiver circuitry 214$_B$. Also, the second input terminal of the transmitter circuitry 212$_A$ is coupled to the second output terminal of the receiver circuitry 214$_B$. In the example of FIG. 2, the third input terminal of the transmitter circuitry 212$_A$ is coupled to the second output terminal of the control circuitry 216. Also, the first output terminal of the transmitter circuitry 212$_A$ is coupled to the first I/O terminal 202. In the example of FIG. 2, the second output terminal of the transmitter circuitry 212$_A$ is coupled to the second I/O terminal 204.

In the illustrated example of FIG. 2, the first input terminal of the receiver circuitry 214$_A$ is coupled to the first output terminal of the shared termination network 210$_A$. Also, the second input terminal of the receiver circuitry 214$_A$ is coupled to the second output terminal of the shared termination network 210$_A$. In the example of FIG. 2, the first output terminal of the receiver circuitry 214$_A$ is coupled to the second input terminal of the transmitter circuitry 212$_B$. Also, the second output terminal of the receiver circuitry 214$_A$ is coupled to the first input terminal of the transmitter circuitry 212$_B$.

In the illustrated example of FIG. 2, the first input terminal of the shared termination network 210$_B$ is coupled to the third I/O terminal 206. Also, the second input terminal of the shared termination network 210$_B$ is coupled to the fourth I/O terminal 208. In the example of FIG. 2, the third input terminal of the shared termination network 210$_B$ is coupled to the third output terminal of the control circuitry 216. Also, the first output terminal of the shared termination network 210$_B$ is coupled to the first input terminal of the receiver circuitry 214$_B$. In the example of FIG. 2, the second output terminal of the shared termination network 210$_B$ is coupled to the second input terminal of the receiver circuitry 214$_B$.

In the illustrated example of FIG. 2, the first input terminal of the transmitter circuitry 212$_B$ is coupled to the second output terminal of the receiver circuitry 214$_A$. Also, the second input terminal of the transmitter circuitry 212$_B$ is coupled to the first output terminal of the receiver circuitry 214$_A$. In the example of FIG. 2, the third input terminal of the transmitter circuitry 212$_B$ is coupled to the fourth output terminal of the control circuitry 216. Also, the first output terminal of the transmitter circuitry 212$_B$ is coupled to the third I/O terminal 206. In the example of FIG. 2, the second output terminal of the transmitter circuitry 212$_B$ is coupled to the fourth I/O terminal 208.

In the illustrated example of FIG. 2, the first input terminal of the receiver circuitry 214$_B$ is coupled to the first output terminal of the shared termination network 210$_B$. Also, the second input terminal of the receiver circuitry 214$_B$ is coupled to the second output terminal of the shared termination network 210$_B$. In the example of FIG. 2, the first output terminal of the receiver circuitry 214$_B$ is coupled to the first input terminal of the transmitter circuitry 212$_A$. Also, the second output terminal of the receiver circuitry 214$_B$ is coupled to the second input terminal of the transmitter circuitry 212$_A$.

In the illustrated example of FIG. 2, the input terminal of the control circuitry 216 is coupled to at least one of a processor (e.g., the processors 106$_A$, 106$_B$), a re-timer (e.g., the re-timers 110$_A$, 110$_B$), or a connector (e.g., the connectors 112$_A$, 112$_B$). Also, the first output terminal of the control circuitry 216 is coupled to the third input terminal of the shared termination network 210$_A$. In the example of FIG. 2, the second output terminal of the control circuitry 216 is coupled to the third input terminal of the transmitter circuitry 212$_A$. Also, the third output terminal of the control circuitry 216 is coupled to the third input terminal of the shared termination network 210$_B$. In the example of FIG. 2, the fourth output terminal of the control circuitry 216 is coupled to the third input terminal of the transmitter circuitry 212$_B$.

In the illustrated example of FIG. 2, the shared termination network 210$_A$ is implemented by one or more switches and at least one of passive electrical components or active electrical components. In the example of FIG. 2, the shared termination network 210$_A$ is referred to as shared because the shared termination network 210$_A$ operates as a termination network for the transmitter circuitry 212$_A$ as well as the receiver circuitry 214$_A$. For example, the shared termination network 210$_A$ interfaces with a transmission path at the first I/O terminal 202 and the second I/O terminal 204 to match a characteristic impedance of the transmission path. By matching the characteristic impedance of the transmission path, the shared termination network 210$_A$ reduces reflection of signals transmitted by the transmitter circuitry 212$_A$ or to the receiver circuitry 214$_A$ at the first I/O terminal 202 and the second I/O terminal 204.

In the illustrated example of FIG. 2, the transmitter circuitry 212$_A$ is implemented by one or more switches and at least one of passive electrical components or active electrical components. The example transmitter circuitry 212$_A$ equalizes signals received from the receiver circuitry 214$_B$ and re-transmits the signals at the first I/O terminal 202 and the second I/O terminal 204. In the example of FIG. 2, the receiver circuitry 214$_A$ is implemented by one or more switches and at least one of passive electrical components or active electrical components. The example receiver circuitry 214$_A$ equalizes signals received at the first I/O terminal 202 and the second I/O terminal 204 and transmits the signals to the transmitter circuitry 212$_B$.

In the illustrated example of FIG. 2, the shared termination network 210$_B$ is implemented by one or more switches and at least one of passive electrical components or active electrical components. In the example of FIG. 2, the shared termination network 210$_B$ is referred to as shared because the shared termination network 210$_B$ operates as a termination network for the transmitter circuitry 212$_B$ as well as the receiver circuitry 214$_B$. For example, the shared termination network 210$_B$ interfaces with a transmission path at the third I/O terminal 206 and the fourth I/O terminal 208 to match a characteristic impedance of the transmission path. By matching the characteristic impedance of the transmission path, the shared termination network 210$_B$ reduces reflection of signals transmitted by the transmitter circuitry 212$_B$ or to the receiver circuitry 214$_B$ at the third I/O terminal 206 and the fourth I/O terminal 208.

In the illustrated example of FIG. 2, the transmitter circuitry 212$_B$ is implemented by one or more switches and at least one of passive electrical components or active electrical components. The example transmitter circuitry 212$_B$ equalizes signals received from the receiver circuitry 214$_A$ and re-transmits the signals at the third I/O terminal 206 and the fourth I/O terminal 208. In the example of FIG. 2, the receiver circuitry 214$_B$ is implemented by one or more switches and at least one of passive electrical components or active electrical components. The example receiver circuitry 214$_B$ equalizes signals received at the third I/O terminal 206 and the fourth I/O terminal 208 and transmits the signals to the transmitter circuitry 212$_A$.

In the illustrated example of FIG. 2, the control circuitry 216 is implemented by at least one of combinational logic circuitry or sequential logic circuitry. The example control circuitry 216 controls operation of the re-driver 200. In the example of FIG. 2, responsive to a re-driver enable signal received at the input terminal of the control circuitry 216, the control circuitry 216 transitions the re-driver 200 from a sleep mode of operation to an active mode of operation. For example, when the re-driver 200 receives a re-driver enable signal and a signal to be transmitted by the re-driver 200, the control circuitry 216 enables one of the transmitter circuitry 212$_A$ or the transmitter circuitry 212; and a corresponding one of the receiver circuitry 214$_A$ or the receiver circuitry 214$_B$.

In the illustrated example of FIG. 2, when the re-driver 200 receives a re-driver enable signal and a signal at the first I/O terminal 202 and the second I/O terminal 204, the control circuitry 216 enables the receiver circuitry 214$_A$ and the transmitter circuitry 212$_B$. Also, when the re-driver 200 receives a re-driver enable signal and a signal at the third I/O terminal 206 and the fourth I/O terminal 208, the control circuitry 216 enables the receiver circuitry 214$_B$ and the transmitter circuitry 212$_A$. As described above, the control circuitry 216 adjusts the impedance of at least one of the shared termination network 210$_A$ or the shared termination network 210$_B$ during enablement of at least one of the transmitter circuitry 212$_A$, the transmitter circuitry 212$_B$, the receiver circuitry 214$_A$, or the receiver circuitry 214$_B$.

For example, during enablement of the receiver circuitry 214$_A$ and the transmitter circuitry 212$_B$, the control circuitry 216 increases the impedance of the shared termination network 210$_A$ and decreases the impedance of the shared termination network 210$_B$. Also, during enablement of the receiver circuitry 214$_B$ and the transmitter circuitry 212$_A$, the control circuitry 216 increases the impedance of the shared termination network 210$_B$ and decreases the impedance of the shared termination network 210$_A$. Also, after at least one of the transmitter circuitry 212$_A$ or the receiver circuitry 214$_A$ is enabled, the control circuitry 216 returns the impedance of the shared termination network 210$_A$ to a steady state value (e.g., 42.5Ω) for nominal operation (e.g., high-speed operation, between 500 MB/s and 40 Gbits/s, up to 4.8 GB/s, between 20 Gbits/s and 120 Gbits/s, up to 14.4 GB/s, etc.) of the re-driver 200. After at least one of the transmitter circuitry 212$_B$ or the receiver circuitry 214$_B$ is enabled, the control circuitry 216 also returns the impedance of the shared termination network 210$_B$ to a steady state value (e.g., 42.5Ω) for nominal operation (e.g., high-speed operation, between 500 MB/s and 40 Gbits/s, up to 4.8 GB/s, between 20 Gbits/s and 120 Gbits/s, up to 14.4 GB/s, etc.) of the re-driver 200. As such, the control circuitry 216 reduces variations from the common mode voltage of at least one of the shared termination network 210$_A$ or the shared termination network 210$_B$ to maintain compliance with the limits specified by USB 3 and USB 4.

Figure 3A:
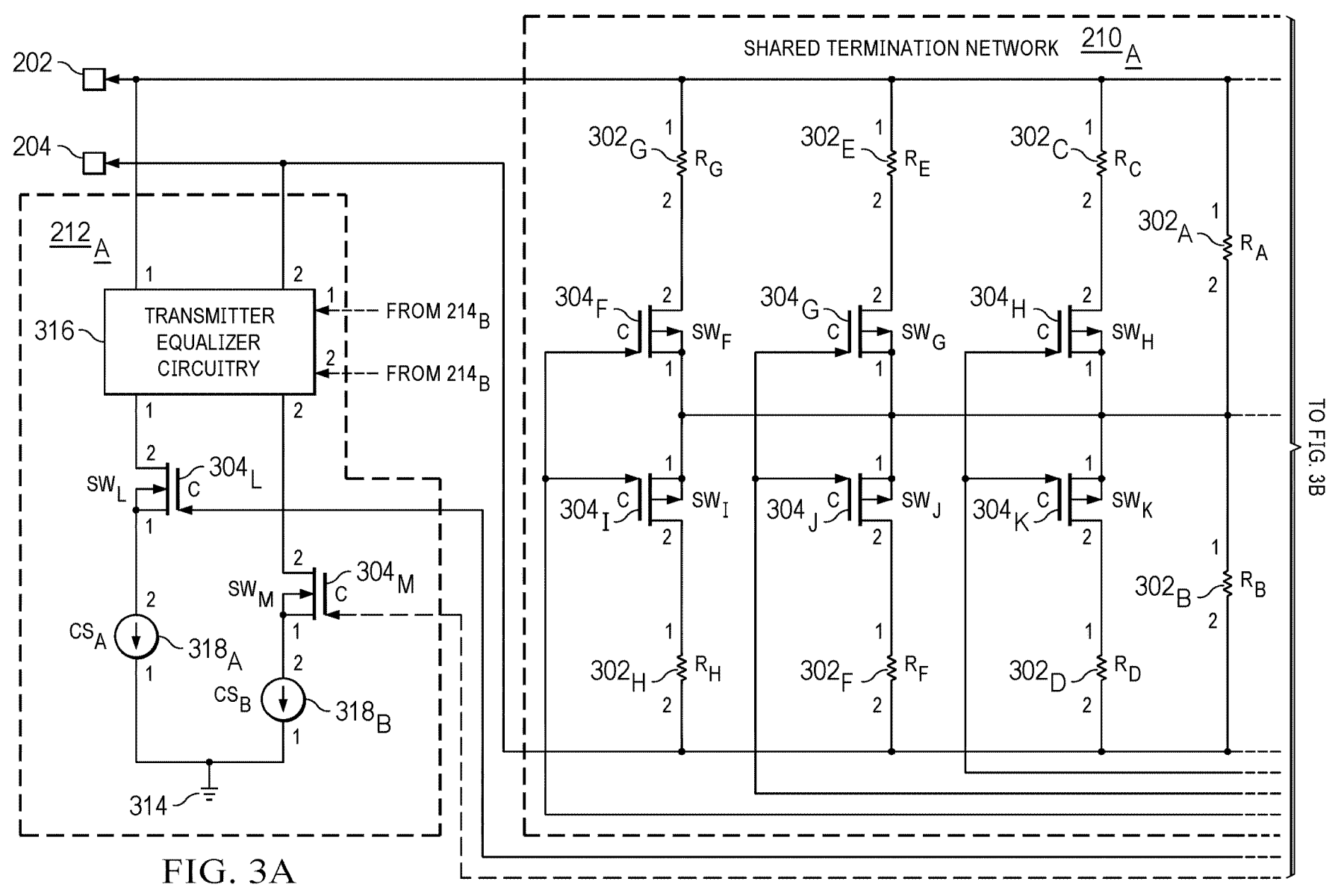
Figure 3B:
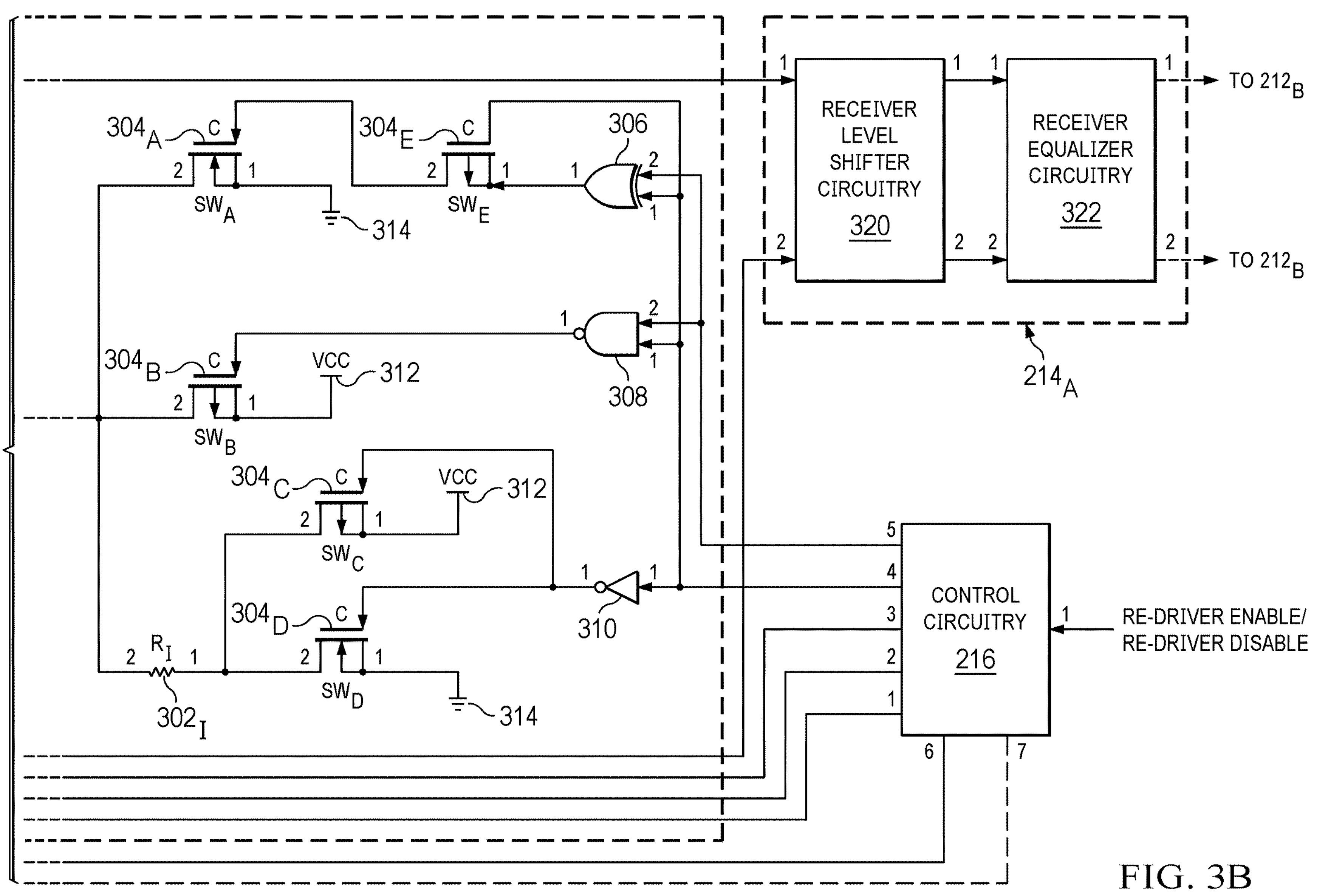

FIG. 3 is a block diagram of an example implementation of the shared termination network 210$_A$, the transmitter circuitry 212$_A$, and the receiver circuitry 214$_A$ of FIG. 2. In the example of FIG. 3, the shared termination network 210$_A$ includes a first example resistor 302$_A$, a second example resistor 302$_B$, a third example resistor 302$_C$, a fourth example resistor 302$_D$, a fifth example resistor 302$_E$, a sixth example resistor 302$_F$, a seventh example resistor 302$_G$, an eighth example resistor 302$_H$, and a ninth example resistor 302$_I$. Also, the shared termination network 210$_A$ includes a first example switch 304$_A$, a second example switch 304$_B$, a third example switch 304$_C$, a fourth example switch 304$_D$, a fifth example switch 304$_E$, a sixth example switch 304$_F$, a seventh example switch 304$_G$, an eighth example switch 304$_H$, a ninth example switch 304$_I$, a tenth example switch 304$_J$, and an eleventh example switch 304$_K$.

In the illustrated example of FIG. 3, the shared termination network 210$_A$ includes an example exclusive OR (XOR) gate 306, an example NOT AND (NAND) gate 308, and an example NOT gate 310. In the example of FIG. 3, the shared termination network 210$_A$ also includes an example supply voltage terminal 312 and an example ground terminal 314. In the example of FIG. 3, the supply voltage terminal 312 is set to 1.8 V (e.g., VCC). Also, the ground terminal 314 is set to 0 V (e.g., VSS).

In the illustrated example of FIG. 3, the transmitter circuitry 212$_A$ includes example transmitter equalizer circuitry 316, a twelfth example switch 304$_L$, and a first example current source 318$_A$. In some examples, the transmitter circuitry 212$_A$ includes a thirteenth example switch 304$_M$, and a second example current source 318$_B$. Also, the transmitter circuitry 212$_A$ includes the ground terminal 314. In the example of FIG. 3, the receiver circuitry 214$_A$ includes example receiver level shifter circuitry 320 and example receiver equalizer circuitry 322.

In the illustrated example of FIG. 3, each of the resistor 302$_A$, the resistor 302$_B$, the resistor 302$_C$, the resistor 302$_D$, the resistor 302$_E$, the resistor 302$_F$, the resistor 302$_G$, the resistor 302$_H$, and the resistor 302$_I$ includes a first terminal and a second terminal. Also, each of the switch 304$_A$, the switch 304$_B$, the switch 304$_C$, the switch 304$_D$, the switch 304$_E$, the switch 304$_F$, the switch 304$_G$, the switch 304$_H$, the switch 304$_I$, the switch 304$_J$, the switch 304$_K$, 304$_L$, and the switch 304$_M$ includes a control terminal (e.g., a gate terminal), a first terminal (e.g., a source terminal), and a second terminal (e.g., a drain terminal). In the example of FIG. 3, each of the XOR gate 306 and the NAND gate 308 includes a first input terminal, a second input terminal, and an output terminal. Also, the NOT gate 310 includes an input terminal and an output terminal.

In the example of FIG. 3, the transmitter equalizer circuitry 316 includes a first input terminal, a second input terminal, a first driver terminal, a first output terminal, and a second output terminal. In some examples, the transmitter equalizer circuitry 316 includes a second driver terminal. In the example of FIG. 3, each of the current source $\mathbf{318}_A$ and the current source $\mathbf{318}_B$ includes a first terminal and a second terminal.

In the illustrated example of FIG. 3, the receiver level shifter circuitry 320 includes a first input terminal, a second input terminal, a first output terminal, and a second output terminal. In the example of FIG. 3, the receiver equalizer circuitry 322 includes a first input terminal, a second input terminal, a first output terminal, and a second output terminal. Also, the control circuitry 216 includes an input terminal, a first output terminal, a second output terminal, a third output terminal, a fourth output terminal, a fifth output terminal, and a sixth output terminal. In some examples, the control circuitry 216 includes a seventh output terminal.

In the illustrated example of FIG. 3, the first terminal of the resistor $\mathbf{302}_A$ is coupled to the first I/O terminal 202. Also, the second terminal of the resistor $\mathbf{302}_A$ is coupled to at least one of the supply voltage terminal 312 or the ground terminal 314. In the example of FIG. 3, the second terminal of the resistor $\mathbf{302}_A$ is coupled to the ground terminal 314 via at least one of the switch $\mathbf{304}_A$ or the resistor $\mathbf{302}_I$ and the switch $\mathbf{304}_D$. Also, the second terminal of the resistor $\mathbf{302}_A$ is coupled to the supply voltage terminal 312 via at least one of the switch $\mathbf{304}_B$ or the resistor $\mathbf{302}_I$ and the switch $\mathbf{304}_C$. For example, the second terminal of the resistor $\mathbf{302}_A$ is coupled to the second terminal of the switch $\mathbf{304}_A$, the second terminal of the switch $\mathbf{304}_B$, and the second terminal of the resistor $\mathbf{302}_I$.

In the illustrated example of FIG. 3, the first terminal of the resistor $\mathbf{302}_B$ is coupled to the second terminal of the resistor $\mathbf{302}_A$. Also, the second terminal of the resistor $\mathbf{302}_B$ is coupled to the second I/O terminal 204. In the example of FIG. 3, the control terminal of the switch $\mathbf{304}_A$ is coupled to the second terminal of the switch $\mathbf{304}_E$, the first terminal of the switch $\mathbf{304}_A$ is coupled to the ground terminal 314, and the second terminal of the switch $\mathbf{304}_A$ is coupled to the second terminal of the resistor $\mathbf{302}_A$. Also, the control terminal of the switch $\mathbf{304}_B$ is coupled to the output terminal of the NAND gate 308, the first terminal of the switch $\mathbf{304}_B$ is coupled to the supply voltage terminal 312, and the second terminal of the switch $\mathbf{304}_B$ is coupled to the second terminal of the resistor $\mathbf{302}_A$.

In the illustrated example of FIG. 3, the first terminal of the resistor $\mathbf{302}_I$ is coupled to the second terminal of the switch $\mathbf{304}_C$ and the second terminal of the switch $\mathbf{304}_D$. Also, the second terminal of the resistor $\mathbf{302}_I$ is coupled to the second terminal of the resistor $\mathbf{302}_A$. In the example of FIG. 3, the control terminal of the switch $\mathbf{304}_C$ is coupled to the output terminal of the NOT gate 310, the first terminal of the switch $\mathbf{304}_C$ is coupled to the supply voltage terminal 312, and the second terminal of the switch $\mathbf{304}_C$ is coupled to the first terminal of the resistor $\mathbf{302}_I$. Also, the control terminal of the switch $\mathbf{304}_D$ is coupled to the output terminal of the NOT gate 310, the first terminal of the switch $\mathbf{304}_D$ is coupled to the ground terminal 314, and the second terminal of the switch $\mathbf{304}_D$ is coupled to the first terminal of the resistor $\mathbf{302}_I$.

In the illustrated example of FIG. 3, the control terminal of the switch $\mathbf{304}_E$ is coupled to the fourth output terminal of the control circuitry 216, the first terminal of the switch $\mathbf{304}_E$ is coupled to the output terminal of the XOR gate 306, and the second terminal of the switch $\mathbf{304}_E$ is coupled to the control terminal of the switch $\mathbf{304}_A$. In the example of FIG. 3, the first input terminal of the XOR gate 306 is coupled to the fourth output terminal of the control circuitry 216 and the second input terminal of the XOR gate 306 is coupled to the fifth output terminal of the control circuitry 216. Also, the output terminal of the XOR gate 306 is coupled to the first terminal of the switch $\mathbf{304}_E$.

In the illustrated example of FIG. 3, the first input terminal of the NAND gate 308 is coupled to the fourth output terminal of the control circuitry 216 and the second input terminal of the NAND gate 308 is coupled to the fifth output terminal of the control circuitry 216. Also, the output terminal of the NAND gate 308 is coupled to the control terminal of the switch $\mathbf{304}_B$. In the example of FIG. 3, the input terminal of the NOT gate 310 is coupled to the fourth output terminal of the control circuitry 216 and the output terminal of the NOT gate 310 is coupled to the control terminal of the switch $\mathbf{304}_C$ and the control terminal of the switch $\mathbf{304}_D$.

In the illustrated example of FIG. 3, the first terminal of the resistor $\mathbf{302}_C$ is coupled to the first I/O terminal 202. Also, the second terminal of the resistor $\mathbf{302}_C$ is coupled to the second terminal of the switch $\mathbf{304}_H$. In the example of FIG. 3, the control terminal of the switch $\mathbf{304}_H$ is coupled to the third output terminal of the control circuitry 216, the first terminal of the switch $\mathbf{304}_H$ is coupled to the second terminal of the resistor $\mathbf{302}_A$, and the second terminal of the switch $\mathbf{304}_H$ is coupled to the second terminal of the resistor $\mathbf{302}_C$.

In the illustrated example of FIG. 3, the control terminal of the switch $\mathbf{304}_K$ is coupled to the third output terminal of the control circuitry 216, the first terminal of the switch $\mathbf{304}_K$ is coupled to the first terminal of the switch $\mathbf{304}_H$ and the second terminal of the resistor $\mathbf{302}_A$, and the second terminal of the switch $\mathbf{304}_K$ is coupled to the first terminal of the resistor $\mathbf{302}_D$. In the example of FIG. 3, the first terminal of the resistor $\mathbf{302}_D$ is coupled to the second terminal of the switch $\mathbf{304}_K$. Also, the second terminal of the resistor $\mathbf{302}_D$ is coupled to the second I/O terminal 204.

In the illustrated example of FIG. 3, the first terminal of the resistor $\mathbf{302}_E$ is coupled to the first I/O terminal 202. Also, the second terminal of the resistor $\mathbf{302}_E$ is coupled to the second terminal of the switch $\mathbf{304}_G$. In the example of FIG. 3, the control terminal of the switch $\mathbf{304}_G$ is coupled to the second output terminal of the control circuitry 216, the first terminal of the switch $\mathbf{304}_G$ is coupled to the second terminal of the resistor $\mathbf{302}_A$, and the second terminal of the switch $\mathbf{304}_G$ is coupled to the second terminal of the resistor $\mathbf{302}_E$.

In the illustrated example of FIG. 3, the control terminal of the switch $\mathbf{304}_J$ is coupled to the second output terminal of the control circuitry 216, the first terminal of the switch $\mathbf{304}_J$ is coupled to the first terminal of the switch $\mathbf{304}_G$ and the second terminal of the resistor $\mathbf{302}_A$, and the second terminal of the switch $\mathbf{304}_J$ is coupled to the first terminal of the resistor $\mathbf{302}_F$. In the example of FIG. 3, the first terminal of the resistor $\mathbf{302}_F$ is coupled to the second terminal of the switch $\mathbf{304}_J$. Also, the second terminal of the resistor $\mathbf{302}_F$ is coupled to the second I/O terminal 204.

In the illustrated example of FIG. 3, the first terminal of the resistor $\mathbf{302}_G$ is coupled to the first I/O terminal 202. Also, the second terminal of the resistor $\mathbf{302}_G$ is coupled to the second terminal of the switch $\mathbf{304}_F$. In the example of FIG. 3, the control terminal of the switch $304_F$ is coupled to the first output terminal of the control circuitry 216, the first terminal of the switch $304_F$ is coupled to the second terminal of the resistor $302_A$, and the second terminal of the switch $304_F$ is coupled to the second terminal of the resistor $302_G$.

In the illustrated example of FIG. 3, the control terminal of the switch $304_I$ is coupled to the first output terminal of the control circuitry 216, the first terminal of the switch $304_I$ is coupled to the first terminal of the switch $304_F$ and the second terminal of the resistor $302_A$, and the second terminal of the switch $304_I$ is coupled to the first terminal of the resistor $302_H$. In the example of FIG. 3, the first terminal of the resistor $302_H$ is coupled to the second terminal of the switch $304_I$. Also, the second terminal of the resistor $302_H$ is coupled to the second I/O terminal 204.

In the illustrated example of FIG. 3, the first input terminal of the transmitter equalizer circuitry 316 is coupled to the first output terminal of the receiver circuitry $214_B$ and the second input terminal of the transmitter equalizer circuitry 316 is coupled to the second output terminal of the receiver circuitry $214_B$. Also, the first output terminal of the transmitter equalizer circuitry 316 is coupled to the first I/O terminal 202 and the second output terminal of the transmitter equalizer circuitry 316 is coupled to the second I/O terminal 204. In the example of FIG. 3, the first driver terminal of the transmitter equalizer circuitry 316 is coupled to the second terminal of the switch $304_L$. In some examples, the second driver terminal of the transmitter equalizer circuitry 316 is coupled to the second terminal of the switch $304_M$.

In the illustrated example of FIG. 3, the control terminal of the switch $304_L$ is coupled to the sixth output terminal of the control circuitry 216, the first terminal of the switch $304_L$ is coupled to the second terminal of the current source $318_A$, and the second terminal of the switch $304_L$ is coupled to the first driver terminal of the transmitter equalizer circuitry 316. Also, the first terminal of the current source $318_A$ is coupled to the ground terminal 314 and the second terminal of the current source $318_A$ is coupled to the first terminal of the switch $304_L$. In some examples, the control terminal of the switch $304_M$ is coupled to the seventh output terminal of the control circuitry 216, the first terminal of the switch $304_M$ is coupled to the second terminal of the current source $318_B$, and the second terminal of the switch $304_M$ is coupled to the second driver terminal of the transmitter equalizer circuitry 316. Also, in such examples, the first terminal of the current source $318_B$ is coupled to the ground terminal 314 and the second terminal of the current source $318_B$ is coupled to the first terminal of the switch $304_M$.

In the illustrated example of FIG. 3, the first input terminal of the receiver level shifter circuitry 320 is coupled to the first I/O terminal 202 and the second input terminal of the receiver level shifter circuitry 320 is coupled to the second I/O terminal 204. Also, the first output terminal of the receiver level shifter circuitry 320 is coupled to the first input terminal of the receiver equalizer circuitry 322 and the second output terminal of the receiver level shifter circuitry 320 is coupled to the second input terminal of the receiver equalizer circuitry 322. In the example of FIG. 3, the first input terminal of the receiver equalizer circuitry 322 is coupled to the first output terminal of the receiver level shifter circuitry 320 and the second input terminal of the receiver equalizer circuitry 322 is coupled to the second output terminal of the receiver level shifter circuitry 320. Also, the first output terminal of the receiver equalizer circuitry 322 is coupled to the second input terminal of the transmitter circuitry $212_B$ and the second output terminal of the receiver equalizer circuitry 322 is coupled to the first input terminal of the transmitter circuitry $212_B$.

In the illustrated example of FIG. 3, the input terminal of the control circuitry 216 is coupled to at least one of a processor (e.g., the processors $106_A$, $106_B$), a re-timer (e.g., the re-timers $110_A$, $110_B$), or a connector (e.g., the connectors $112_A$, $112_B$). In the example of FIG. 3, the first output terminal of the control circuitry 216 is coupled to the control terminal of the switch $304_F$ and the control terminal of the switch $304_I$. Also, the second output terminal of the control circuitry 216 is coupled to the control terminal of the switch $304_G$ and the control terminal of the switch $304_J$. In the example of FIG. 3, the third output terminal of the control circuitry 216 is coupled to the control terminal of the switch $304_H$ and the control terminal of the switch $304_K$.

In the illustrated example of FIG. 3, the fourth output terminal of the control circuitry 216 is coupled to the control terminal of the switch $304_E$, the first input terminal of the XOR gate 306, the first input terminal of the NAND gate 308, and the input terminal of the NOT gate 310. Also, the fifth output terminal of the control circuitry 216 is coupled to the second input terminal of the XOR gate 306 and the second input terminal of the NAND gate 308. In the example of FIG. 3, the sixth output terminal of the control circuitry 216 is coupled to the control terminal of the switch $304_L$. In some examples, the seventh output terminal of the control circuitry 216 is coupled to the control terminal of the switch $304_M$. While FIG. 3 illustrates an example manner of implementing the shared termination network $210_A$, the transmitter circuitry $212_A$, and the receiver circuitry $214_A$ of FIG. 2, the shared termination network $210_B$, the transmitter circuitry $212_B$, and the receiver circuitry $214_B$ of FIG. 2 may be implemented similarly to the shared termination network $210_A$, the transmitter circuitry $212_A$, and the receiver circuitry $214_A$ of FIG. 3, respectively.

In the illustrated example of FIG. 3, the transmitter equalizer circuitry 316 is implemented by one or more switches. For example, the transmitter equalizer circuitry 316 is implemented by one or more negative-positive-negative (NPN) bipolar junction transistors (BJTs). In the example of FIG. 3, the transmitter equalizer circuitry 316 equalizes signals received from the receiver circuitry 214 at the first input terminal and the second input terminal of the transmitter equalizer circuitry 316. Also, the transmitter equalizer circuitry 316 re-transmits signals at the first I/O terminal 202 and the second I/O terminal 204.

In the illustrated example of FIG. 3, the current source $318_A$ is implemented by one or more switches and at least one of passive electrical components or active electrical components. In some examples, the current source $318_B$ is implemented by one or more switches and at least one of passive electrical components or active electrical components. The current source $318_A$ and, in some examples, the current source $318_B$ operate as a driver for the transmitter equalizer circuitry 316. The driver of the transmitter equalizer circuitry 316 (e.g., the current source $318_A$ and, in some examples, the current source $318_B$) can be at least one of enabled or disabled by the control circuitry 216 by at least one of closing or opening the switch $304_L$ and, in some examples, the switch $304_M$ (e.g., via at least one transmitter driver enable signal).

In the illustrated example of FIG. 3, the receiver level shifter circuitry 320 is implemented by one or more switches and at least one of passive electrical components or active electrical components. For example, the receiver level shifter circuitry 320 is implemented by one or more NPN BJTs and one or more current sources. The example receiver level shifter circuitry 320 at least one of increases or decreases the voltage between the first I/O terminal 202 and the second I/O terminal 204 to a value to operate the receiver equalizer circuitry 322.

In the illustrated example of FIG. 3, the receiver equalizer circuitry 322 is implemented by one or more switches and at least one of passive electrical components or active electrical components. The example receiver equalizer circuitry 322 equalizes signals received at the first I/O terminal 202 and the second I/O terminal 204. For example, the receiver equalizer circuitry 322 amplifies high-frequency portions of signals received at the first I/O terminal 202 and the second I/O terminal 204 and attenuates low-frequency portions of the signals to equalize frequency-dependent attenuation resulting from one or more transmission paths. Also, the receiver equalizer circuitry 322 transmits the signals to the transmitter circuitry 212$_B$.

In the illustrated example of FIG. 3, the control circuitry 216 is implemented by at least one of combinational logic circuitry or sequential logic circuitry. For example, the control circuitry 216 is implemented by digital logic circuitry (e.g., at least one of combinational digital logic circuitry or sequential digital logic circuitry). In the example of FIG. 3, the control circuitry 216 controls the impedance of the shared termination network 210$_A$. For example, between enablement of at least one of the transmitter circuitry 212$_A$ or the receiver circuitry 214$_A$ and nominal operation of the re-driver 200, there is an idle period during which the control circuitry 216 adjusts the impedance of the shared termination network 210$_A$ to compensate for transients in the common mode voltage of the shared termination network 210$_A$. Also, the control circuitry 216 returns the impedance of the shared termination network 210$_A$ to a steady state value (e.g., 42.5Ω) for nominal operation of the re-driver 200 after the common mode voltage of the shared termination network 210$_A$ has reached a steady state value. In this manner, the control circuitry 216 maintains compliance of the re-driver 200 with the limits specified by USB 3 and USB 4.

In the illustrated example of FIG. 3, during enablement of the transmitter circuitry 212$_A$, the control circuitry 216 decreases the impedance of the shared termination network 210$_A$ to maintain compliance with USB 3 and USB 4. For example, there are at least two cases for enablement of the transmitter circuitry 212$_A$. In an example first case, the common mode voltage terminal (e.g., the second terminal of the resistor 302$_A$) of the shared termination network 210$_A$ is coupled to the supply voltage terminal 312 via the switch 304$_B$ and via the resistor 302$_I$ and the switch 304$_C$. For example, in the first case, the switch 304$_A$ is open, the switch 304$_B$ is closed, the switch 304$_C$ is closed, and the switch 304$_D$ is open.

In the example first case, the control circuitry 216 closes the switches 304$_F$, 304$_G$, 304$_H$, 304$_I$, 304$_J$, 304$_K$ before enablement of the transmitter circuitry 212$_A$. As such, the control circuitry 216 decreases the impedance of the shared termination network 210$_A$ before enablement of the transmitter circuitry 212$_A$. In the first case, the control circuitry 216 enables the transmitter circuitry 212$_A$ by closing at least one of the switch 304$_L$ or the switch 304$_M$ (e.g., via at least one transmitter driver enable signal). As such, the voltage at the common mode terminal (e.g., the second terminal of the resistor 302$_A$) of the shared termination network 210$_A$ transitions from VCC (e.g., 1.8 V) to an active value for the transmitter circuitry 212$_A$. Advantageously, by decreasing the impedance of the shared termination network 210$_A$ before enablement of the transmitter circuitry 212$_A$, the control circuitry 216 maintains compliance with USB 3 and USB 4 despite at least one transient that may occur in the voltage at the common mode terminal (e.g., the second terminal of the resistor 302$_A$) of the shared termination network 210$_A$ during enablement of the transmitter circuitry 212$_A$.

In the example first case, after the voltage at the common mode terminal (e.g., the second terminal of the resistor 302$_A$) of the shared termination network 210$_A$ reaches a steady state value, the control circuitry 216 returns the impedance of the shared termination network 210$_A$ to a steady state value (e.g., 42.5Ω) for nominal operation of the re-driver 200. For example, a first threshold amount of time (e.g., 10-15 microseconds (μs)) after the control circuitry 216 enables the transmitter circuitry 212$_A$, the control circuitry 216 returns the impedance of the shared termination network 210$_A$ to a value for steady state operation (e.g., nominal operation) of the re-driver 200 that has been trimmed for process variations of the re-driver 200. In the example first case, after startup of the transmitter circuitry 212$_A$ has completed, the re-driver 200 enters nominal operation. For example, a second threshold amount of time (e.g., 30 μs) after the control circuitry 216 sets the impedance of the shared termination network 210$_A$ to the steady state value, the re-driver 200 enters nominal operation.

As described above, there are at least two cases for enablement of the transmitter circuitry 212$_A$. In an example second case, the common mode voltage terminal (e.g., the second terminal of the resistor 302$_A$) of the shared termination network 210$_A$ is coupled to the supply voltage terminal 312 via the resistor 302$_I$ and the switch 304$_C$. For example, in the second case, the switch 304$_A$ is open, the switch 304$_B$ is open, the switch 304$_C$ is closed, and the switch 304$_D$ is open.

In the example second case, the control circuitry 216 closes the switches 304$_F$, 304$_G$, 304$_H$, 304$_I$, 304$_J$, 304$_K$ before enablement of the transmitter circuitry 212$_A$. As such, the control circuitry 216 decreases the impedance of the shared termination network 210$_A$ before enablement of the transmitter circuitry 212$_A$. In the second case, the control circuitry 216 enables the transmitter circuitry 212$_A$ by closing at least one of the switch 304$_L$ or the switch 304$_M$ (e.g., via at least one transmitter driver enable signal). Also, at enablement of the transmitter circuitry 212$_A$, the control circuitry 216 closes the switch 304$_B$. As such, the voltage at the common mode terminal (e.g., the second terminal of the resistor 302$_A$) of the shared termination network 210$_A$ transitions from VCC (e.g., 1.8 V) to an active value for the transmitter circuitry 212$_A$. Advantageously, by decreasing the impedance of the shared termination network 210$_A$ before enablement of the transmitter circuitry 212$_A$, the control circuitry 216 maintains compliance with USB 3 and USB 4 despite at least one transient that may occur in the voltage at the common mode terminal (e.g., the second terminal of the resistor 302$_A$) of the shared termination network 210$_A$ during enablement of the transmitter circuitry 212$_A$.

In the example second case, after the voltage at the common mode terminal (e.g., the second terminal of the resistor 302$_A$) of the shared termination network 210$_A$ reaches a steady state value, the control circuitry 216 returns the impedance of the shared termination network 210$_A$ to a steady state value (e.g., 42.5Ω) for nominal operation of the re-driver 200. For example, a first threshold amount of time (e.g., 10-15 μs) after the control circuitry 216 enables the transmitter circuitry 212$_A$, the control circuitry 216 returns the impedance of the shared termination network 210$_A$ to a value for steady state operation (e.g., nominal operation) of the re-driver 200 that has been trimmed for PVT variations of the re-driver 200. In the example second case, after startup of the transmitter circuitry $\mathbf{212}_A$ has completed, the re-driver 200 enters nominal operation. For example, a second threshold amount of time (e.g., 30 μs) after the control circuitry 216 sets the impedance of the shared termination network $\mathbf{210}_A$ to the steady state value, the re-driver 200 enters nominal operation.

In some examples, the control circuitry 216 staggers the bias current of the transmitter circuitry $\mathbf{212}_A$ when enabling the transmitter circuitry $\mathbf{212}_A$. For example, the control circuitry 216 quasi-enables the transmitter circuitry $\mathbf{212}_A$ before enabling the transmitter circuitry $\mathbf{212}_A$. To quasi-enable the transmitter circuitry $\mathbf{212}_A$, the control circuitry 216 enables the transmitter circuitry $\mathbf{212}_A$ with a lower bias current than when the transmitter circuitry $\mathbf{212}_A$ is in nominal operation. For example, the transmitter circuitry $\mathbf{212}_A$ closes the switch $\mathbf{304}_L$ and keeps the switch $\mathbf{304}_M$ open. A threshold amount of time (e.g., 10-15 μs) after quasi-enabling the transmitter circuitry $\mathbf{212}_A$, the control circuitry 216 enables the transmitter circuitry $\mathbf{212}_A$ with a bias current for nominal operation. To enable the transmitter circuitry $\mathbf{212}_A$ with a bias current for nominal operation, the control circuitry 216 closes the switch $\mathbf{304}_L$ and closes the switch $\mathbf{304}_M$.

In the illustrated example of FIG. 3, during enablement of the receiver circuitry $\mathbf{214}_A$, the control circuitry 216 increases the impedance of the shared termination network $\mathbf{210}_A$ to maintain compliance with USB 3 and USB 4. For example, there are at least two cases for enablement of the receiver circuitry $\mathbf{214}_A$. In an example first case, the common mode voltage terminal (e.g., the second terminal of the resistor $\mathbf{302}_A$) of the shared termination network $\mathbf{210}_A$ is coupled to the ground terminal 314 via the switch $\mathbf{304}_A$ and via the resistor $\mathbf{302}_I$ and the switch $\mathbf{304}_D$. For example, in the first case, the switch $\mathbf{304}_A$ is closed, the switch $\mathbf{304}_B$ is open, the switch $\mathbf{304}_C$ is open, and the switch $\mathbf{304}_D$ is closed.

In the example first case, the control circuitry 216 opens the switches $\mathbf{304}_F$, $\mathbf{304}_G$, $\mathbf{304}_H$, $\mathbf{304}_I$, $\mathbf{304}_J$, $\mathbf{304}_K$ before enablement of the receiver circuitry $\mathbf{214}_A$. As such, the control circuitry 216 increases the impedance of the shared termination network $\mathbf{210}_A$ before enablement of the receiver circuitry $\mathbf{214}_A$. In the first case, the control circuitry 216 enables the receiver circuitry $\mathbf{214}_A$ by opening the switch $\mathbf{304}_A$ and the switch $\mathbf{304}_D$ (e.g., via the XOR gate 306 and the switch $\mathbf{304}_E$ and via the NOT gate 310, respectively) and closing the switch $\mathbf{304}_B$ and the switch $\mathbf{304}_C$ (e.g., via the NAND gate 308 and via the NOT gate 310, respectively). As such, the voltage at the common mode terminal (e.g., the second terminal of the resistor $\mathbf{302}_A$) of the shared termination network $\mathbf{210}_A$ transitions from VSS (e.g., 0 V) to VCC (e.g., 1.8 V). Advantageously, by increasing the impedance of the shared termination network $\mathbf{210}_A$ before enablement of the receiver circuitry $\mathbf{214}_A$, the control circuitry 216 maintains compliance with USB 3 and USB 4 despite at least one transient that may occur in the voltage at the common mode terminal (e.g., the second terminal of the resistor $\mathbf{302}_A$) of the shared termination network $\mathbf{210}_A$ during enablement of the receiver circuitry $\mathbf{214}_A$. For example, by increasing the impedance of the shared termination network $\mathbf{210}_A$ before enablement of the receiver circuitry $\mathbf{214}_A$, the control circuitry 216 prevents the common mode voltage of a device at the far end of a transmission path including the re-driver 200 from varying outside the limits set by USB 3 and USB 4.

In the example first case, after the voltage at the common mode terminal (e.g., the second terminal of the resistor $\mathbf{302}_A$) of the shared termination network $\mathbf{210}_A$ reaches a steady state value, the control circuitry 216 returns the impedance of the shared termination network $\mathbf{210}_A$ to a steady state value (e.g., 42.5Ω) for nominal operation of the re-driver 200. For example, a first threshold amount of time (e.g., 10-15 μs) after the control circuitry 216 enables the receiver circuitry $\mathbf{214}_A$, the control circuitry 216 returns the impedance of the shared termination network $\mathbf{210}_A$ to a value for steady state operation (e.g., nominal operation) of the re-driver 200 that has been trimmed for process variations of the re-driver 200. In the example first case, after startup of the receiver circuitry $\mathbf{214}_A$ has completed, the re-driver 200 enters nominal operation. For example, a second threshold amount of time (e.g., 30 μs) after the control circuitry 216 sets the impedance of the shared termination network $\mathbf{210}_A$ to the steady state value, the re-driver 200 enters nominal operation.

As described above, there are at least two cases for enablement of the receiver circuitry $\mathbf{214}_A$. In an example second case, the common mode voltage terminal (e.g., the second terminal of the resistor $\mathbf{302}_A$) of the shared termination network $\mathbf{210}_A$ is coupled to the ground terminal 314 via the resistor $\mathbf{302}_I$ and the switch $\mathbf{304}_D$. For example, in the second case, the switch $\mathbf{304}_A$ is open, the switch $\mathbf{304}_B$ is open, the switch $\mathbf{304}_C$ is open, and the switch $\mathbf{304}_D$ is closed.

In the example second case, the control circuitry 216 opens the switches $\mathbf{304}_F$, $\mathbf{304}_G$, $\mathbf{304}_H$, $\mathbf{304}_I$, $\mathbf{304}_J$, $\mathbf{304}_K$ before enablement of the receiver circuitry $\mathbf{214}_A$. As such, the control circuitry 216 increases the impedance of the shared termination network $\mathbf{210}_A$ before enablement of the receiver circuitry $\mathbf{214}_A$. In the second case, the control circuitry 216 enables the receiver circuitry $\mathbf{214}_A$ by opening the switch $\mathbf{304}_D$ (e.g., via the NOT gate 310) and closing the switch $\mathbf{304}_B$ and the switch $\mathbf{304}_C$ (e.g., via the NAND gate 308 and via the NOT gate 310, respectively). As such, the voltage at the common mode terminal (e.g., the second terminal of the resistor $\mathbf{302}_A$) of the shared termination network $\mathbf{210}_A$ transitions from VSS (e.g., 0 V) to VCC (e.g., 1.8 V). Advantageously, by increasing the impedance of the shared termination network $\mathbf{210}_A$ before enablement of the receiver circuitry $\mathbf{214}_A$, the control circuitry 216 maintains compliance with USB 3 and USB 4 despite at least one transient that may occur in the voltage at the common mode terminal (e.g., the second terminal of the resistor $\mathbf{302}_A$) of the shared termination network $\mathbf{210}_A$ during enablement of the receiver circuitry $\mathbf{214}_A$. For example, by increasing the impedance of the shared termination network $\mathbf{210}_A$ before enablement of the receiver circuitry $\mathbf{214}_A$, the control circuitry 216 prevents the common mode voltage of a device at the far end of a transmission path including the re-driver 200 from varying outside the limits set by USB 3 and USB 4.

In the example second case, after the voltage at the common mode terminal (e.g., the second terminal of the resistor $\mathbf{302}_A$) of the shared termination network $\mathbf{210}_A$ reaches a steady state value, the control circuitry 216 returns the impedance of the shared termination network $\mathbf{210}_A$ to a steady state value (e.g., 42.5Ω) for nominal operation of the re-driver 200. For example, a first threshold amount of time (e.g., 10-15 μs) after the control circuitry 216 enables the receiver circuitry $\mathbf{214}_A$, the control circuitry 216 returns the impedance of the shared termination network $\mathbf{210}_A$ to a value for steady state operation (e.g., nominal operation) of the re-driver 200 that has been trimmed for PVT variations of the re-driver 200. In the example second case, after startup of the receiver circuitry $\mathbf{214}_A$ has completed, the re-driver 200 enters nominal operation. For example, a second threshold amount of time (e.g., 30 μs) after the control circuitry 216 sets the impedance of the shared termination network $\mathbf{210}_A$ to the steady state value, the re-driver 200 enters nominal operation.

In the illustrated example of FIG. 3, the switches $\mathbf{304}_A$, $\mathbf{304}_D$, $\mathbf{304}_L$, $\mathbf{304}_M$ are N-channel metal-oxide semiconductor field-effect transistors (MOSFETs). Alternatively, the switches $\mathbf{304}_A$, $\mathbf{304}_D$, $\mathbf{304}_L$, $\mathbf{304}_M$ may be at least one of N-channel field-effect transistors (FETs), N-channel insulated-gate bipolar transistors (IGBTs), N-channel junction field effect transistors (JFETs), NPN BJTs, or, with slight modifications, P-type equivalent devices. In the example of FIG. 3, the switches $\mathbf{304}_B$, $\mathbf{304}_C$, $\mathbf{304}_E$, $\mathbf{304}_F$, $\mathbf{304}_G$, $\mathbf{304}_H$, $\mathbf{304}_I$, $\mathbf{304}_J$, $\mathbf{304}_K$ are P-channel MOSFETs. Alternatively, the switches $\mathbf{304}_B$, $\mathbf{304}_C$, $\mathbf{304}_E$, $\mathbf{304}_F$, $\mathbf{304}_G$, $\mathbf{304}_H$, $\mathbf{304}_I$, $\mathbf{304}_J$, $\mathbf{304}_K$ may be at least one of P-channel FETs, P-channel IGBTs, P-channel JFETs, positive-negative-positive (PNP) BJTs, or, with slight modifications, N-type equivalent devices. The switches $\mathbf{304}_A$, $\mathbf{304}_B$, $\mathbf{304}_C$, $\mathbf{304}_D$, $\mathbf{304}_E$, $\mathbf{304}_F$, $\mathbf{304}_G$, $\mathbf{304}_H$, $\mathbf{304}_I$, $\mathbf{304}_J$, $\mathbf{304}_K$, $\mathbf{304}_L$, $\mathbf{304}_M$ may be depletion mode devices, drain-extended devices, enhancement mode devices, natural transistors, or other type of device structure transistors. Furthermore, the switches $\mathbf{304}_A$, $\mathbf{304}_B$, $\mathbf{304}_C$, $\mathbf{304}_D$, $\mathbf{304}_E$, $\mathbf{304}_F$, $\mathbf{304}_G$, $\mathbf{304}_H$, $\mathbf{304}_I$, $\mathbf{304}_J$, $\mathbf{304}_K$, $\mathbf{304}_L$, $\mathbf{304}_M$ may be implemented in/over a silicon substrate (Si), a silicon carbide substrate (SiC), a gallium nitride substrate (GaN), or a gallium arsenide substrate (GaAs).

While an example manner of implementing one or more of the re-drivers $\mathbf{108}_A$, $\mathbf{108}_B$, $\mathbf{108}_C$, $\mathbf{108}_D$ of FIG. 1 is illustrated in FIG. 2, one or more of the elements, processes, or devices illustrated in FIG. 2 may be at least one of combined, divided, re-arranged, omitted, eliminated, or implemented in any other way. Further, the example shared termination network $\mathbf{210}_A$, the example shared termination network $\mathbf{210}_B$, the example transmitter circuitry $\mathbf{212}_A$, the example transmitter circuitry $\mathbf{212}_B$, the example receiver circuitry $\mathbf{214}_A$, the example receiver circuitry $\mathbf{214}_B$, the example control circuitry 216, or, more generally, the example re-driver 200 of FIG. 2, may be implemented by hardware alone or by hardware in combination with at least one of software or firmware. Thus, for example, any of the example shared termination network $\mathbf{210}_A$, the example shared termination network $\mathbf{210}_B$, the example transmitter circuitry $\mathbf{212}_A$, the example transmitter circuitry $\mathbf{212}_B$, the example receiver circuitry $\mathbf{214}_A$, the example receiver circuitry $\mathbf{214}_B$, the example control circuitry 216, or, more generally, the example re-driver 200, could be implemented by at least one of programmable circuitry in combination with machine-readable instructions (e.g., firmware or software), processor circuitry, analog circuit(s), digital circuit(s), logic circuit(s), programmable processor(s), programmable microcontroller(s), graphics processing unit(s) (GPU(s)), digital signal processor(s) (DSP(s)), ASIC(s), programmable logic device(s) (PLD(s)), or field programmable logic device(s) (FPLD(s)) such as FPGAs. Further still, the example re-driver 200 of FIG. 2 may include at least one of one or more elements, one or more processes, or one or more devices in addition to, or instead of, those illustrated in FIG. 2, or may include more than one of any or all of the illustrated elements, processes, and devices.

Figure 4:
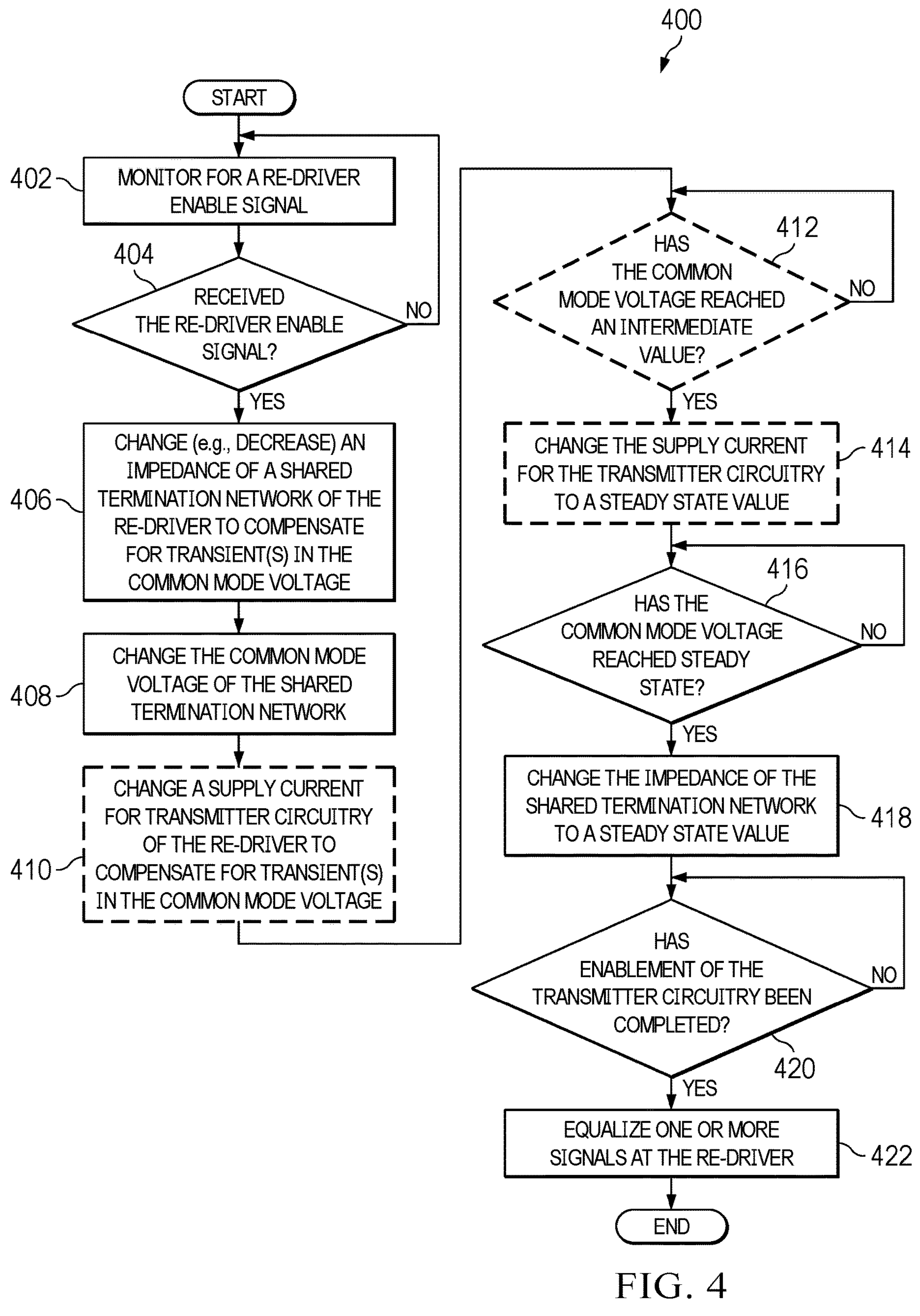
FIG. 4 is a flowchart representative of at least one of example machine-readable instructions or example operations that may be at least one of executed, instantiated, or performed using an example programmable circuitry implementation of the control circuitry of FIG. 2 to control the shared termination network of FIG. 2 during enablement of the transmitter circuitry of FIG. 2.

FIG. 4 is a flowchart representative of at least one of example machine-readable instructions or example operations 400 that may be at least one of executed, instantiated, or performed using an example programmable circuitry implementation of the control circuitry 216 of FIG. 2 to control the shared termination network $\mathbf{210}_A$ of FIG. 2 during enablement of the transmitter circuitry $\mathbf{212}_A$ of FIG. 2. The at least one of the example machine-readable instructions or the example operations 400 of FIG. 4 begin at block 402, at which the control circuitry 216 monitors for a re-driver enable signal. For example, the control circuitry 216 monitors the input terminal of the control circuitry 216 for a re-driver enable signal.

In the illustrated example of FIG. 4, at block 404, the control circuitry 216 determines whether the re-driver enable signal has been received. Responsive to (e.g., based on) the control circuitry 216 determining that the re-driver enable signal has been received (block 404: YES), the at least one of the example machine-readable instructions or the example operations 400 proceed to block 406. Responsive to (e.g., based on) the control circuitry 216 determining that the re-driver enable signal has not been received (block 404: NO), the at least one of the example machine-readable instructions or the example operations 400 return to block 402.

In the illustrated example of FIG. 4, at block 406, the control circuitry 216 changes an impedance of the shared termination network $\mathbf{210}_A$ of the re-driver 200 to a first value to compensate for at least one transient in the common mode voltage of the shared termination network $\mathbf{210}_A$. For example, at block 406, the control circuitry 216 closes the switches $\mathbf{304}_F$, $\mathbf{304}_G$, $\mathbf{304}_H$, $\mathbf{304}_I$, $\mathbf{304}_J$, $\mathbf{304}_K$ to decrease the impedance of the shared termination network $\mathbf{210}_A$ to the first value. To close the switches $\mathbf{304}_F$, $\mathbf{304}_G$, $\mathbf{304}_H$, $\mathbf{304}_I$, $\mathbf{304}_J$, $\mathbf{304}_K$, the control circuitry 216 transmits a logic low value (e.g., 0 V) to respective control terminals of the switches $\mathbf{304}_F$, $\mathbf{304}_G$, $\mathbf{304}_H$, $\mathbf{304}_I$, $\mathbf{304}_J$, $\mathbf{304}_K$. At block 408, the control circuitry 216 changes the common mode voltage of the shared termination network $\mathbf{210}_A$. For example, at block 408, the control circuitry 216 changes the common mode voltage of the shared termination network $\mathbf{210}_A$ from VCC (e.g., 1.8 V) to an active value for the transmitter circuitry $\mathbf{212}_A$.

In some examples, at block 410, the control circuitry 216 changes a supply current for the transmitter circuitry $\mathbf{212}_A$ of the re-driver 200 (e.g., changes a supply current for transmitter circuitry of the re-driver 200) to a second value to compensate for at least one transient in the common mode voltage of the shared termination network $\mathbf{210}_A$. For example, at block 410, the control circuitry 216 closes the switch $\mathbf{304}_L$ and keeps the switch $\mathbf{304}_M$ open. In such examples, at block 412, the control circuitry 216 determines if the common mode voltage of the shared termination network $\mathbf{210}_A$ has reached an intermediate value between VCC (e.g., 1.8 V) to the active value for the transmitter circuitry $\mathbf{212}_A$. For example, at block 412, the control circuitry 216 determines if a timer maintained by the control circuitry 216 has satisfied a first threshold amount of time (e.g., 10-15 μs).

Responsive to (e.g., based on) the control circuitry 216 determining that the common mode voltage of the shared termination network $\mathbf{210}_A$ has not reached the intermediate value (e.g., block 412: NO), the at least one of the example machine-readable instructions or the example operations 400 return to block 412. Responsive to (e.g., based on) the control circuitry 216 determining that the common mode voltage of the shared termination network $\mathbf{210}_A$ has reached the intermediate value (e.g., block 412: YES), the at least one of the example machine-readable instructions or the example operations 400 proceed to block 414. At block 414, the control circuitry 216 changes the supply current for the transmitter circuitry $\mathbf{212}_A$ to a steady state value. For example, at block 414, the control circuitry 216 closes the switch $\mathbf{304}_M$ and keeps the switch $\mathbf{304}_L$ closed to increase the supply current of the transmitter circuitry $\mathbf{212}_A$ to a third value greater than the second value.

In the illustrated example of FIG. 4, at block 416, the control circuitry 216 determines if the common mode voltage of the shared termination network $\mathbf{210}_A$ has reached steady state (e.g., within a threshold of the active value for the transmitter circuitry $\mathbf{212}_A$). For example, at block 416, the control circuitry 216 determines if a timer maintained by the control circuitry 216 has satisfied a second threshold amount of time (e.g., 10-15 μs). Responsive to (e.g., based on) the control circuitry 216 determining that the common mode voltage of the shared termination network $\mathbf{210}_A$ has not reached steady state (e.g., block 416: NO), the at least one of the example machine-readable instructions or the example operations 400 return to block 416.

Responsive to (e.g., based on) the control circuitry 216 determining that the common mode voltage of the shared termination network $\mathbf{210}_A$ has reached steady state (e.g., block 416: YES), the at least one of the example machine-readable instructions or the example operations 400 proceed to block 418. At block 418, the control circuitry 216 changes the impedance of the shared termination network $\mathbf{210}_A$ to a steady state value (e.g., 42.5Ω). For example, at block 418, the control circuitry 216 returns the switches $\mathbf{304}_F$, $\mathbf{304}_G$, $\mathbf{304}_H$, $\mathbf{304}_I$, $\mathbf{304}_J$, $\mathbf{304}_K$ to a trimmed state to increase the impedance of the shared termination network $\mathbf{210}_A$ to a fourth value greater than the first value.

In the illustrated example of FIG. 4, at block 420, the control circuitry 216 determines if enablement of the transmitter circuitry $\mathbf{212}_A$ has been completed. For example, at block 420, the control circuitry 216 determines if a timer maintained by the control circuitry 216 has satisfied a third threshold amount of time (e.g., 30 μs). Responsive to (e.g., based on) the control circuitry 216 determining that enablement of the transmitter circuitry $\mathbf{212}_A$ has not been completed (block 420: NO), the at least one of the example machine-readable instructions or the example operations 400 return to block 420. Responsive to (e.g., based on) the control circuitry 216 determining that enablement of the transmitter circuitry $\mathbf{212}_A$ has been completed (block 420: YES), the at least one of the example machine-readable instructions or the example operations 400 proceeds to block 422. At block 422, the transmitter circuitry $\mathbf{212}_A$ equalizes one or more signals at the re-driver 200.

Figure 5:
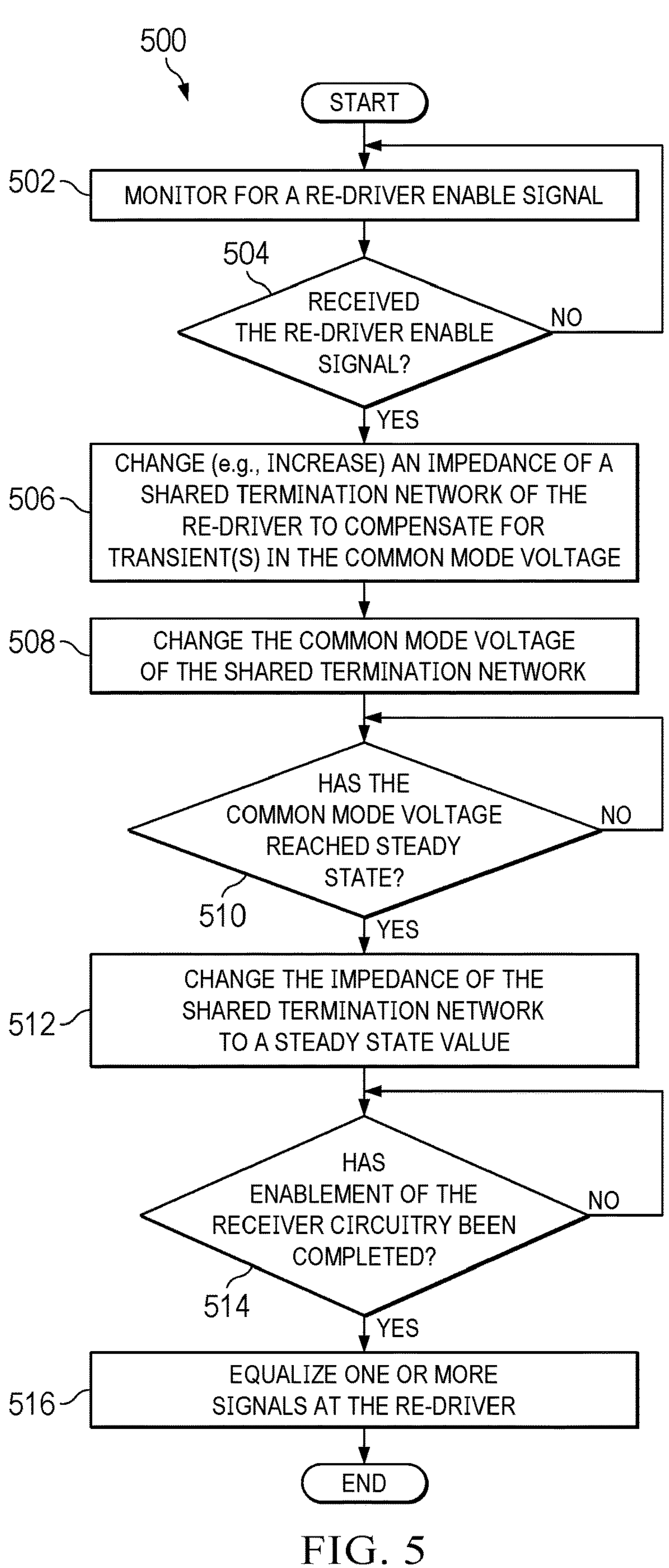
FIG. 5 is a flowchart representative of at least one of example machine-readable instructions or example operations that may be at least one of executed, instantiated, or performed using an example programmable circuitry implementation of the control circuitry of FIG. 2 to control the shared termination network of FIG. 2 during enablement of the receiver circuitry of FIG. 2.

FIG. 5 is a flowchart representative of at least one of example machine-readable instructions or example operations 500 that may be at least one of executed, instantiated, or performed using an example programmable circuitry implementation of the control circuitry 216 of FIG. 2 to control the shared termination network $\mathbf{210}_A$ of FIG. 2 during enablement of the receiver circuitry $\mathbf{214}_A$ of FIG. 2. The at least one of the example machine-readable instructions or the example operations 500 of FIG. 5 begin at block 502, at which the control circuitry 216 monitors for a re-driver enable signal. For example, the control circuitry 216 monitors the input terminal of the control circuitry 216 for a re-driver enable signal.

In the illustrated example of FIG. 5, at block 504, the control circuitry 216 determines whether the re-driver enable signal has been received. Responsive to (e.g., based on) the control circuitry 216 determining that the re-driver enable signal has been received (block 504: YES), the at least one of the example machine-readable instructions or the example operations 500 proceed to block 506. Responsive to (e.g., based on) the control circuitry 216 determining that the re-driver enable signal has not been received (block 504: NO), the at least one of the example machine-readable instructions or the example operations 500 return to block 502.

In the illustrated example of FIG. 5, at block 506, the control circuitry 216 changes an impedance of the shared termination network $\mathbf{210}_A$ of the re-driver 200 to a first value to compensate for at least one transient in the common mode voltage of the shared termination network $\mathbf{210}_A$. For example, at block 506, the control circuitry 216 opens the switches $\mathbf{304}_F$, $\mathbf{304}_G$, $\mathbf{304}_H$, $\mathbf{304}_I$, $\mathbf{304}_J$, $\mathbf{304}_K$ to increase the impedance of the shared termination network $\mathbf{210}_A$ to the first value. To open the switches $\mathbf{304}_F$, $\mathbf{304}_G$, $\mathbf{304}_H$, $\mathbf{304}_I$, $\mathbf{304}_J$, $\mathbf{304}_K$, the control circuitry 216 transmits a logic high value (e.g., 5 V) to respective control terminals of the switches $\mathbf{304}_F$, $\mathbf{304}_G$, $\mathbf{304}_H$, $\mathbf{304}_I$, $\mathbf{304}_J$, $\mathbf{304}_K$. At block 508, the control circuitry 216 changes the common mode voltage of the shared termination network $\mathbf{210}_A$. For example, at block 508, the control circuitry 216 changes the common mode voltage of the shared termination network $\mathbf{210}_A$ from VSS (e.g., 0 V) to VCC (e.g., 1.8 V).

In the illustrated example of FIG. 5, at block 510, the control circuitry 216 determines if the common mode voltage of the shared termination network $\mathbf{210}_A$ has reached steady state (e.g., VCC). For example, at block 510, the control circuitry 216 determines if a timer maintained by the control circuitry 216 has satisfied a first threshold amount of time (e.g., 10-15 μs). Responsive to (e.g., based on) the control circuitry 216 determining that the common mode voltage of the shared termination network $\mathbf{210}_A$ has not reached steady state (e.g., block 510: NO), the at least one of the example machine-readable instructions or the example operations 500 return to block 510.

Responsive to (e.g., based on) the control circuitry 216 determining that the common mode voltage of the shared termination network $\mathbf{210}_A$ has reached steady state (e.g., block 510: YES), the at least one of the example machine-readable instructions or the example operations 500 proceed to block 512. At block 512, the control circuitry 216 changes the impedance of the shared termination network $\mathbf{210}_A$ to a steady state value (e.g., 42.5Ω). For example, at block 512, the control circuitry 216 returns the switches $\mathbf{304}_F$, $\mathbf{304}_G$, $\mathbf{304}_H$, $\mathbf{304}_I$, $\mathbf{304}_J$, $\mathbf{304}_K$ to a trimmed state to decrease the impedance of the shared termination network $\mathbf{210}_A$ to a second value less than the first value.

In the illustrated example of FIG. 5, at block 514, the control circuitry 216 determines if enablement of the receiver circuitry $\mathbf{214}_A$ has been completed. For example, at block 514, the control circuitry 216 determines if a timer maintained by the control circuitry 216 has satisfied a second threshold amount of time (e.g., 30 μs). Responsive to (e.g., based on) the control circuitry 216 determining that enablement of the receiver circuitry $\mathbf{214}_A$ has not been completed (block 514: NO), the at least one of the example machine-readable instructions or the example operations 500 return to block 514. Responsive to (e.g., based on) the control circuitry 216 determining that enablement of the receiver circuitry $\mathbf{214}_A$ has been completed (block 514: YES), the at least one of the example machine-readable instructions or the example operations 500 proceeds to block 516. At block 516, the receiver circuitry $\mathbf{214}_A$ equalizes one or more signals at the re-driver 200.

Figure 6:
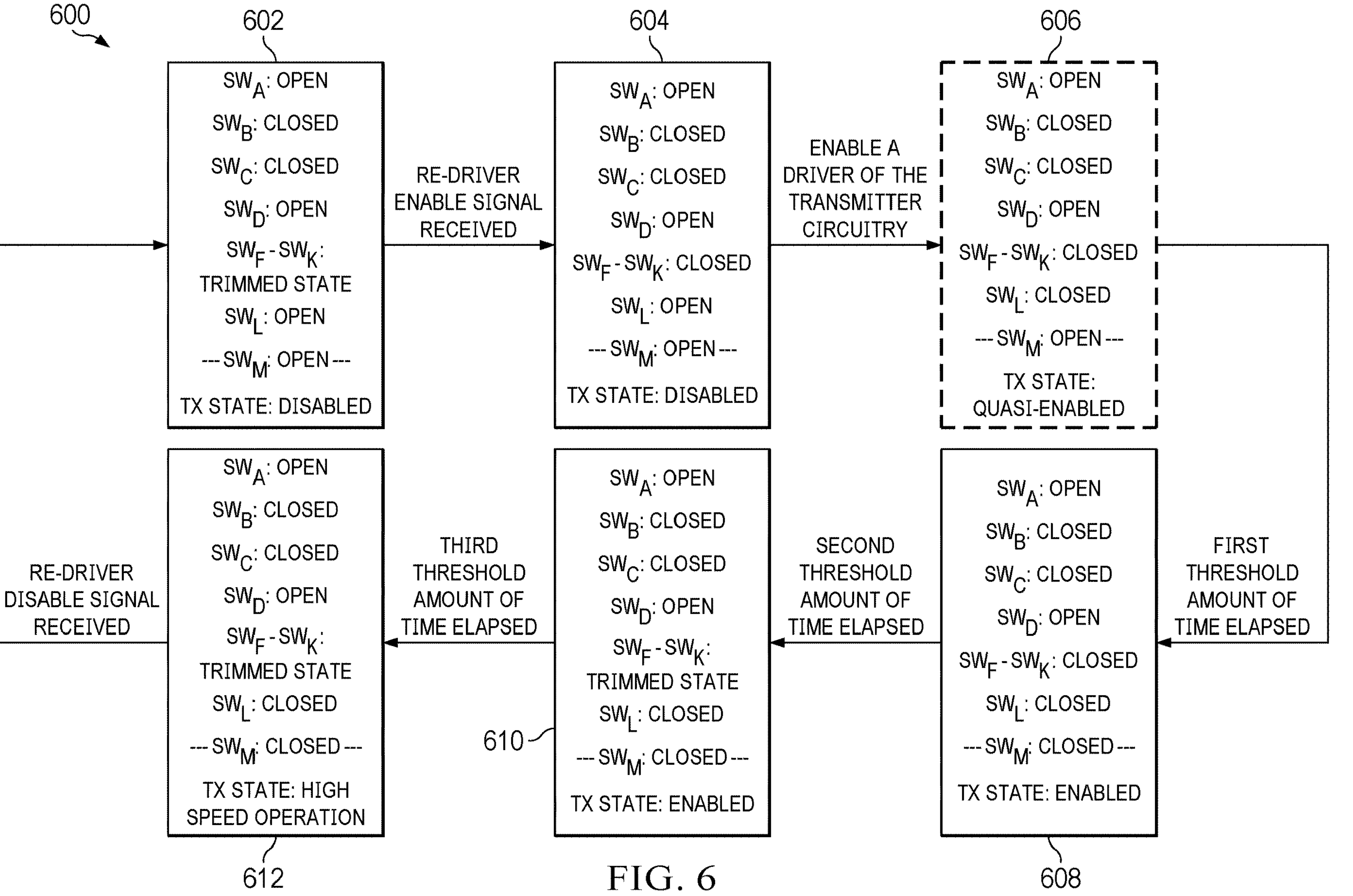
FIG. 6 is a flowchart representative of a first example finite state machine that may be at least one of executed, instantiated, or performed using an example programmable circuitry implementation of the re-driver of FIG. 2 during enablement of the transmitter circuitry of FIG. 2.

FIG. 6 is a flowchart representative of a first example finite state machine (FSM) 600 that may be at least one of executed, instantiated, or performed using an example programmable circuitry implementation of the re-driver 200 of FIG. 2 during enablement of the transmitter circuitry $\mathbf{212}_A$ of FIG. 2. In the example of FIG. 6, the FSM 600 corresponds to the first case for enablement of the transmitter circuitry 212$_A$ described above. The FSM 600 of FIG. 6 begins in state 602, at which the re-driver 200 is in a sleep mode of operation. For example, in state 602, the switch 304$_A$ is open, the switch 304$_B$ is closed, the switch 304$_C$ is closed, and the switch 304$_D$ is open. Also, in state 602, the switches 304$_F$, 304$_G$, 304$_H$, 304$_I$, 304$_J$, 304$_K$ are in a trimmed state. In state 602, the switch 304$_L$ is open. In examples where the bias current of the transmitter circuitry 212$_A$ can be staggered, the switch 304$_M$ is also open in state 602. As such, the transmitter circuitry 212$_A$ is disabled in state 602.

In the illustrated example of FIG. 6, the FSM 600 transitions from state 602 to state 604 responsive to (e.g., based on) the control circuitry 216 receiving a re-driver enable signal. In state 604, the switch 304$_A$ is open, the switch 304 is closed, the switch 304$_C$ is closed, and the switch 304$_D$ is open. Also, in state 604, the switches 304$_F$, 304$_G$, 304$_H$, 304$_I$, 304$_J$, 304$_K$ are closed (e.g., to decrease an impedance of the shared termination network 210$_A$). In state 604, the switch 304$_L$ is open. In examples where the bias current of the transmitter circuitry 212$_A$ can be staggered, the switch 304$_M$ is also open in state 604. As such, the transmitter circuitry 212$_A$ is disabled in state 604.

In the illustrated example of FIG. 6, the FSM 600 transitions out of state 604 responsive to (e.g., based on) the control circuitry 216 enabling a driver for the transmitter circuitry 212$_A$. For example, the FSM 600 transitions out of state 604 responsive to (e.g., based on) the control circuitry 216 closing at least one of the switch 304$_L$ or the switch 304$_M$. In some examples, the FSM 600 transitions out of state 604 into state 606. For example, when the bias current of the transmitter circuitry 212$_A$ can be staggered, the switch 304$_L$ is closed, and the switch 304$_M$ is open, the FSM 600 transitions out of state 604 to state 606.

In the illustrated example of FIG. 6, in state 606, the switch 304$_A$ is open, the switch 304$_B$ is closed, the switch 304$_C$ is closed, and the switch 304$_D$ is open. Also, in state 606, the switches 304$_F$, 304$_G$, 304$_H$, 304$_I$, 304$_J$, 304$_K$ are closed (e.g., to decrease an impedance of the shared termination network 210$_A$). In state 606, the switch 304$_L$ is closed and the switch 304$_M$ is open. As such, the transmitter circuitry 212$_A$ is quasi-enabled in state 606.

In the illustrated example of FIG. 6, the FSM 600 transitions from state 606 to state 608 responsive to (e.g., based on) the control circuitry 216 determining that a first threshold amount of time (e.g., 10-15 μs) has elapsed. In the example of FIG. 6, the first threshold amount of time corresponds to a threshold amount of time for the common mode voltage of the shared termination network 210$_A$ to reach an intermediate value between VCC and an active value for the transmitter circuitry 212$_A$. In state 608, the switch 304$_A$ is open, the switch 304$_B$ is closed, the switch 304$_C$ is closed, and the switch 304$_D$ is open. Also, in state 608, the switches 304$_F$, 304$_G$, 304$_H$, 304$_I$, 304$_J$, 304$_K$ are closed (e.g., to decrease an impedance of the shared termination network 210$_A$). In state 608, the switch 304$_L$ is closed. In examples where the bias current of the transmitter circuitry 212$_A$ can be staggered, the switch 304$_M$ is also closed in state 608. As such, the transmitter circuitry 212$_A$ is enabled in state 608.

In the illustrated example of FIG. 6, the FSM 600 transitions from state 608 to state 610 responsive to (e.g., based on) the control circuitry 216 determining that a second threshold amount of time (e.g., 10-15 μs) has elapsed. In the example of FIG. 6, the second threshold amount of time corresponds to a threshold amount of time for the common mode voltage of the shared termination network 210$_A$ to reach steady state. In state 610, the switch 304$_A$ is open, the switch 304$_B$ is closed, the switch 304$_C$ is closed, and the switch 304$_D$ is open. Also, in state 610, the switches 304$_F$, 304$_G$, 304$_H$, 304$_I$, 304$_J$, 304$_K$ are in a trimmed state. In state 610, the switch 304$_L$ is closed. In examples where the bias current of the transmitter circuitry 212$_A$ can be staggered, the switch 304$_M$ is also closed in state 610. As such, the transmitter circuitry 212$_A$ is enabled in state 610.

In the illustrated example of FIG. 6, the FSM 600 transitions from state 610 to state 612 responsive to (e.g., based on) the control circuitry 216 determining that a third threshold amount of time (e.g., 30 μs) has elapsed. In state 612, the switch 304$_A$ is open, the switch 304$_B$ is closed, the switch 304$_C$ is closed, and the switch 304$_D$ is open. Also, in state 612, the switches 304$_F$, 304$_G$, 304$_H$, 304$_I$, 304$_J$, 304 are in a trimmed state. In state 612, the switch 304$_L$ is closed. In examples where the bias current of the transmitter circuitry 212$_A$ can be staggered, the switch 304$_M$ is also closed in state 612. In the example of FIG. 6, the third threshold amount of time corresponds to a threshold amount of time for enablement of the transmitter circuitry 212$_A$ to be completed. As such, the transmitter circuitry 212$_A$ is in a high-speed mode of operation in state 612. In the example of FIG. 6, the FSM 600 transitions from state 612 to state 602 responsive to (e.g., based on) the control circuitry 216 receiving a re-driver disable signal.

Figure 7:
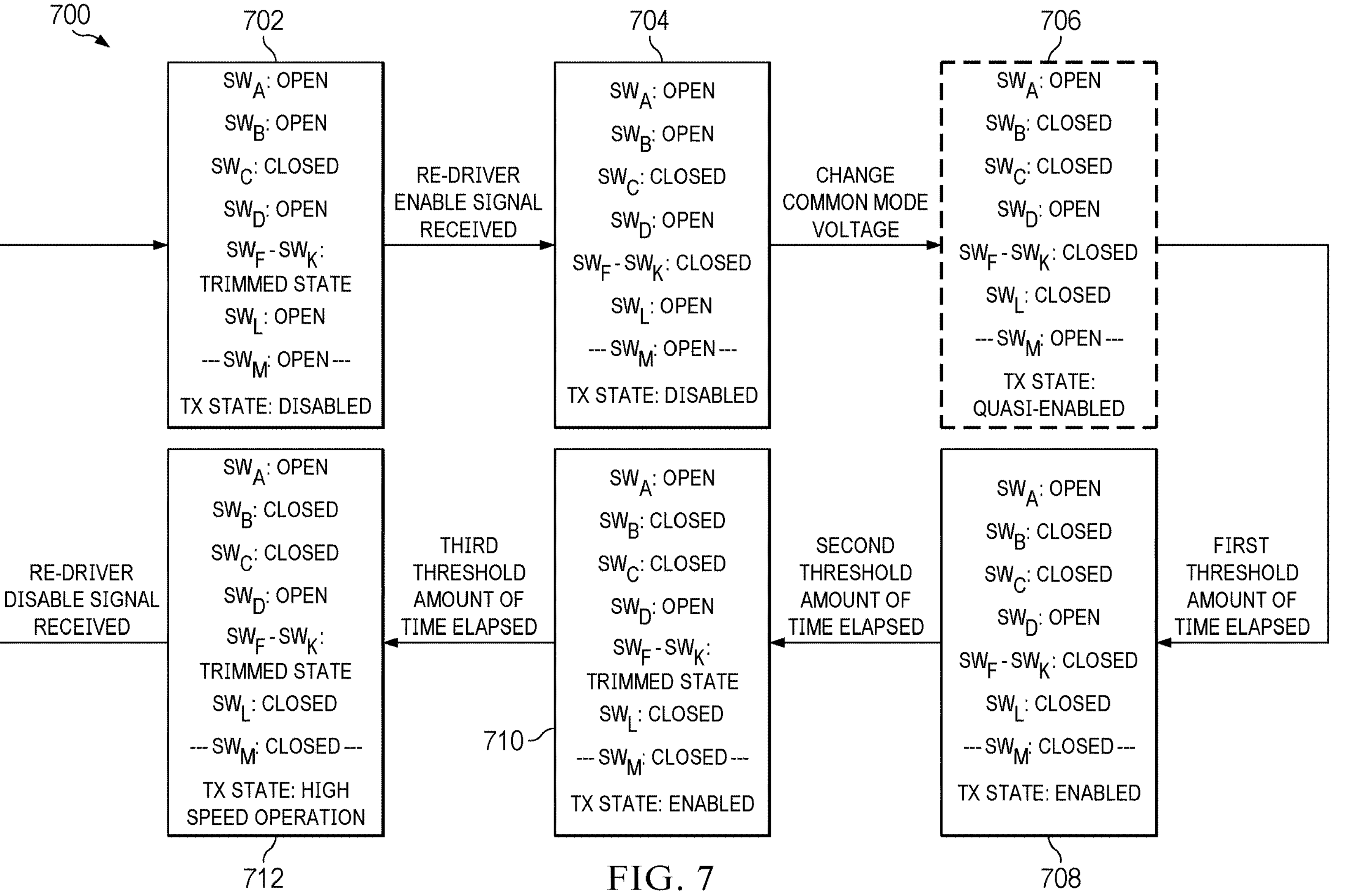
FIG. 7 is a flowchart representative of a second example finite state machine that may be at least one of executed, instantiated, or performed using an example programmable circuitry implementation of the re-driver of FIG. 2 during enablement of the transmitter circuitry of FIG. 2.

FIG. 7 is a flowchart representative of a second example finite state machine (FSM) 700 that may be at least one of executed, instantiated, or performed using an example programmable circuitry implementation of the re-driver 200 of FIG. 2 during enablement of the transmitter circuitry 212$_A$ of FIG. 2. In the example of FIG. 7, the FSM 700 corresponds to the second case for enablement of the transmitter circuitry 212$_A$ described above. The FSM 700 of FIG. 7 begins in state 702, at which the re-driver 200 is in a sleep mode of operation. For example, in state 702, the switch 304$_A$ is open, the switch 304$_B$ is open, the switch 304$_C$ is closed, and the switch 304$_D$ is open. Also, in state 702, the switches 304$_F$, 304$_G$, 304$_H$, 304$_I$, 304$_J$, 304$_K$ are in a trimmed state. In state 702, the switch 304$_L$ is open. In examples where the bias current of the transmitter circuitry 212$_A$ can be staggered, the switch 304$_M$ is also open in state 702. As such, the transmitter circuitry 212$_A$ is disabled in state 702.

In the illustrated example of FIG. 7, the FSM 700 transitions from state 702 to state 704 responsive to (e.g., based on) the control circuitry 216 receiving a re-driver enable signal. In state 704, the switch 304$_A$ is open, the switch 304$_B$ is open, the switch 304$_C$ is closed, and the switch 304$_D$ is open. Also, in state 704, the switches 304$_F$, 304$_G$, 304$_H$, 304$_I$, 304$_J$, 304$_K$ are closed (e.g., to decrease an impedance of the shared termination network 210$_A$). In state 704, the switch 304$_L$ is open. In examples where the bias current of the transmitter circuitry 212$_A$ can be staggered, the switch 304$_M$ is also open in state 704. As such, the transmitter circuitry 212$_A$ is disabled in state 704.

In the illustrated example of FIG. 7, the FSM 700 transitions out of state 704 responsive to (e.g., based on) the control circuitry 216 changing the common mode voltage of the shared termination network 210$_A$. For example, the FSM 700 transitions out of state 704 responsive to (e.g., based on) the control circuitry 216 closing the switch 304$_B$. Also, when the FSM 700 transitions out of state 704, the control circuitry 216 closes at least one of the switch 304$_L$ or the switch 304$_M$. In some examples, the FSM 700 transitions out of state 704 into state 706. For example, when the bias current of the transmitter circuitry 212$_A$ can be staggered, the switch 304$_L$ is closed, the switch 304$_M$ is open, and the control circuitry 216 closes the switch $304_B$, the FSM 700 transitions out of state 704 to state 706.

In the illustrated example of FIG. 7, in state 706, the switch $304_A$ is open, the switch $304_B$ is closed, the switch $304_C$ is closed, and the switch $304_D$ is open. Also, in state 706, the switches $304_F$, $304_G$, $304_H$, $304_I$, $304_J$, $304_K$ are closed (e.g., to decrease an impedance of the shared termination network $210_A$). In state 706, the switch $304_L$ is closed and the switch $304_M$ is open. As such, the transmitter circuitry $212_A$ is quasi-enabled in state 706.

In the illustrated example of FIG. 7, the FSM 700 transitions from state 706 to state 708 responsive to (e.g., based on) the control circuitry 216 determining that a first threshold amount of time (e.g., 10-15 μs) has elapsed. In the example of FIG. 7, the first threshold amount of time corresponds to a threshold amount of time for the common mode voltage of the shared termination network $210_A$ to reach an intermediate value between VCC and an active value for the transmitter circuitry $212_A$. In state 708, the switch $304_A$ is open, the switch $304_B$ is closed, the switch $304_C$ is closed, and the switch $304_D$ is open. Also, in state 708, the switches $304_F$, $304_G$, $304_H$, $304_I$, $304_J$, $304_K$ are closed (e.g., to decrease an impedance of the shared termination network $210_A$). In state 708, the switch $304_L$ is closed. In examples where the bias current of the transmitter circuitry $212_A$ can be staggered, the switch $304_M$ is also closed in state 708. As such, the transmitter circuitry $212_A$ is enabled in state 708.

In the illustrated example of FIG. 7, the FSM 700 transitions from state 708 to state 710 responsive to (e.g., based on) the control circuitry 216 determining that a second threshold amount of time (e.g., 10-15 μs) has elapsed. In the example of FIG. 7, the second threshold amount of time corresponds to a threshold amount of time for the common mode voltage of the shared termination network $210_A$ to reach steady state. In state 710, the switch $304_A$ is open, the switch $304_B$ is closed, the switch $304_C$ is closed, and the switch $304_D$ is open. Also, in state 710, the switches $304_F$, $304_G$, $304_H$, $304_I$, $304_J$, $304_K$ are in a trimmed state. In state 710, the switch $304_L$ is closed. In examples where the bias current of the transmitter circuitry $212_A$ can be staggered, the switch $304_M$ is also closed in state 710. As such, the transmitter circuitry $212_A$ is enabled in state 710.

In the illustrated example of FIG. 7, the FSM 700 transitions from state 710 to state 712 responsive to (e.g., based on) the control circuitry 216 determining that a third threshold amount of time (e.g., 30 μs) has elapsed. In state 712, the switch $304_A$ is open, the switch $304_B$ is closed, the switch $304_C$ is closed, and the switch $304_D$ is open. Also, in state 712, the switches $304_F$, $304_G$, $304_H$, $304_I$, $304_J$, $304_K$ are in a trimmed state. In state 712, the switch $304_L$ is closed. In examples where the bias current of the transmitter circuitry $212_A$ can be staggered, the switch $304_M$ is also closed in state 712. In the example of FIG. 7, the third threshold amount of time corresponds to a threshold amount of time for enablement of the transmitter circuitry $212_A$ to be completed. As such, the transmitter circuitry $212_A$ is in a high-speed mode of operation in state 712. In the example of FIG. 7, the FSM 700 transitions from state 712 to state 702 responsive to (e.g., based on) the control circuitry 216 receiving a re-driver disable signal.

Figure 8:
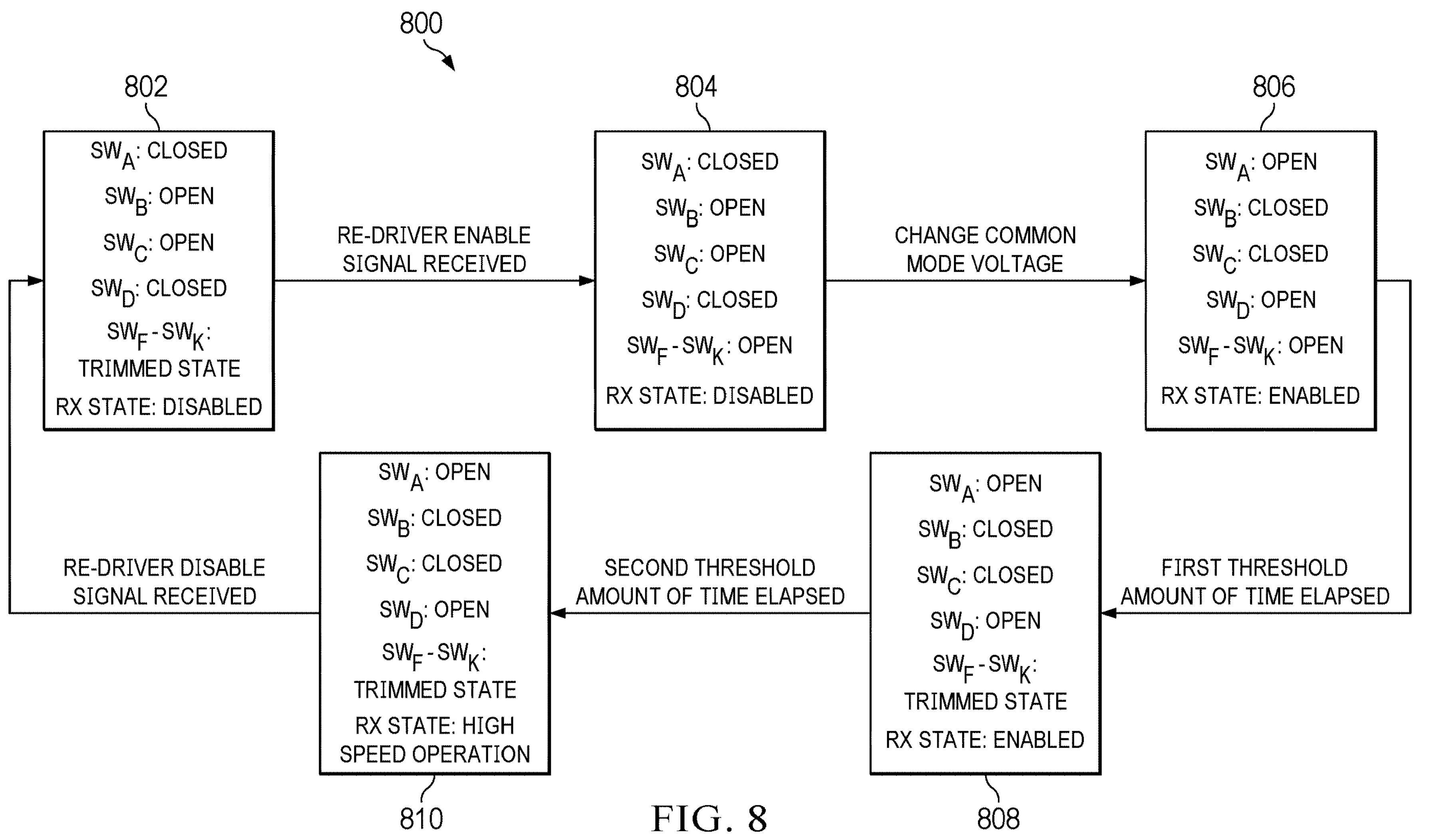
FIG. 8 is a flowchart representative of a first example finite state machine that may be at least one of executed, instantiated, or performed using an example programmable circuitry implementation of the re-driver of FIG. 2 during enablement of the receiver circuitry of FIG. 2.

FIG. 8 is a flowchart representative of a first example finite state machine (FSM) 800 that may be at least one of executed, instantiated, or performed using an example programmable circuitry implementation of the re-driver 200 of FIG. 2 during enablement of the receiver circuitry $214_A$ of FIG. 2. In the example of FIG. 8, the FSM 800 corresponds to the first case for enablement of the receiver circuitry $214_A$ described above. The FSM 800 of FIG. 8 begins in state 802, at which the re-driver 200 is in a sleep mode of operation. For example, in state 802, the switch $304_A$ is closed, the switch $304_B$ is open, the switch $304_C$ is open, and the switch $304_D$ is closed. Also, in state 802, the switches $304_F$, $304_G$, $304_H$, $304_I$, $304_J$, $304_K$ are in a trimmed state. In state 802, the receiver circuitry $214_A$ is disabled.

In the illustrated example of FIG. 8, the FSM 800 transitions from state 802 to state 804 responsive to (e.g., based on) the control circuitry 216 receiving a re-driver enable signal. In state 804, the switch $304_A$ is closed, the switch $304_B$ is open, the switch $304_C$ is open, and the switch $304_D$ is closed. Also, in state 804, the switches $304_F$, $304_G$, $304_H$, $304_I$, $304_J$, $304_K$ are open (e.g., to increase an impedance of the shared termination network $210_A$). In state 804, the receiver circuitry $214_A$ is disabled.

In the illustrated example of FIG. 8, the FSM 800 transitions from state 804 to state 806 responsive to (e.g., based on) the control circuitry 216 changing the common mode voltage of the shared termination network $210_A$. For example, the FSM 800 transitions from state 804 to state 806 responsive to (e.g., based on) the control circuitry 216 closing the switch $304_B$ and the switch $304_C$ and opening the switch $304_A$ and the switch $304_D$. In state 806, the switch $304_A$ is open, the switch $304_B$ is closed, the switch $304_C$ is closed, and the switch $304_D$ is open. Also, in state 806, the switches $304_F$, $304_G$, $304_H$, $304_I$, $304_J$, $304_K$ are open (e.g., to increase an impedance of the shared termination network $210_A$). In state 806, the receiver circuitry $214_A$ is enabled.

In the illustrated example of FIG. 8, the FSM 800 transitions from state 806 to state 808 responsive to (e.g., based on) the control circuitry 216 determining that a first threshold amount of time (e.g., 10-15 μs) has elapsed. In the example of FIG. 8, the first threshold amount of time corresponds to a threshold amount of time for the common mode voltage of the shared termination network $210_A$ to reach steady state. In state 808, the switch $304_A$ is open, the switch $304_B$ is closed, the switch $304_C$ is closed, and the switch $304_D$ is open. Also, in state 808, the switches $304_F$, $304_G$, $304_H$, $304_I$, $304_J$, $304_K$ are in a trimmed state. In state 808, the receiver circuitry $214_A$ is enabled.

In the illustrated example of FIG. 8, the FSM 800 transitions from state 808 to state 810 responsive to (e.g., based on) the control circuitry 216 determining that a second threshold amount of time (e.g., 30 μs) has elapsed. For example, the second threshold amount of time corresponds to a threshold amount of time for enablement of the receiver circuitry $214_A$ to be completed. In state 810, the switch $304_A$ is open, the switch $304_B$ is closed, the switch $304_C$ is closed, and the switch $304_D$ is open. Also, in state 810, the switches $304_F$, $304_G$, $304_H$, $304_I$, $304_J$, $304_K$ are in a trimmed state. In state 810, the receiver circuitry $214_A$ is in a high-speed mode of operation. In the example of FIG. 8, the FSM 800 transitions from state 810 to state 802 responsive to (e.g., based on) the control circuitry 216 receiving a re-driver disable signal.

Figure 9:
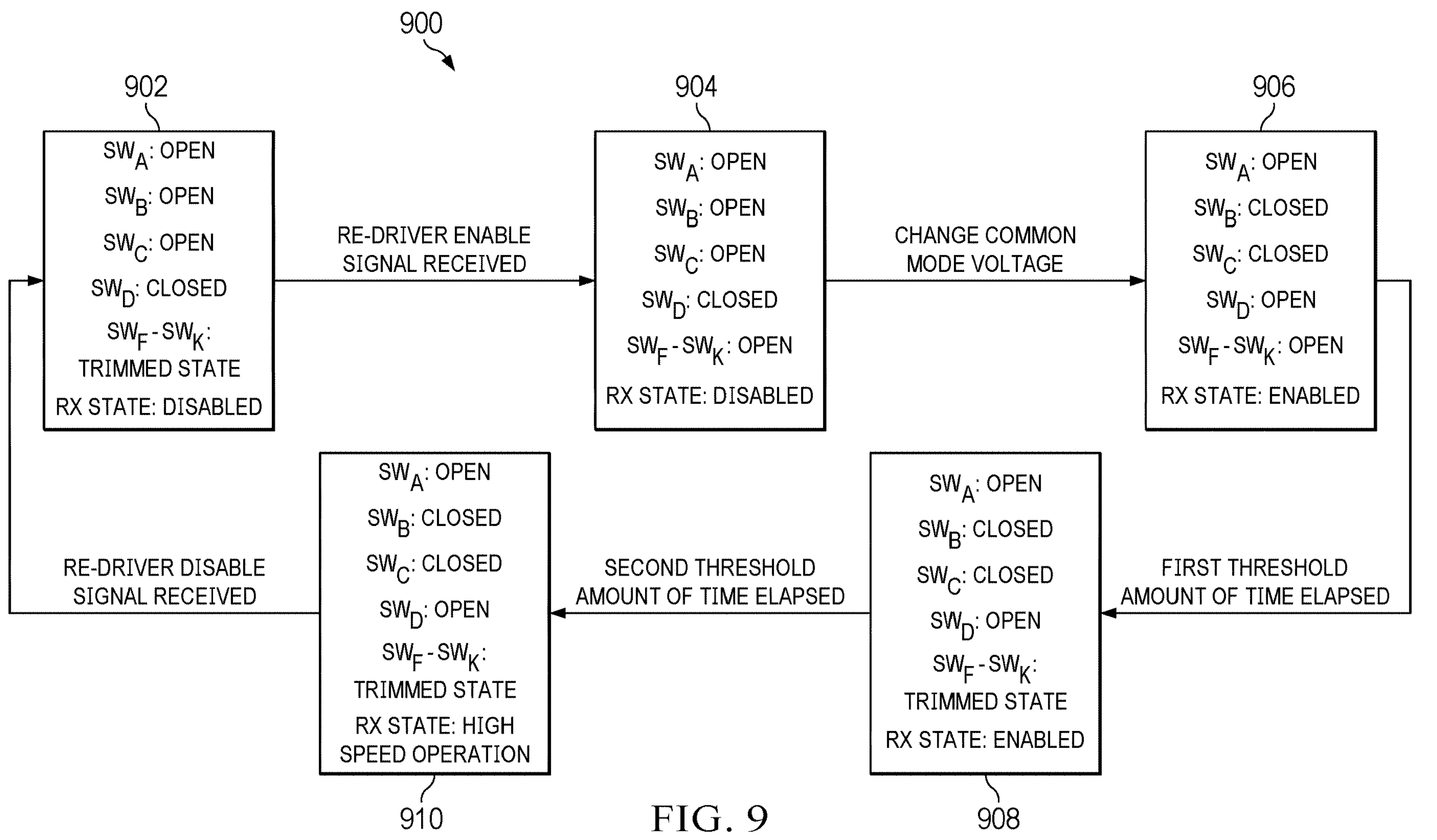
FIG. 9 is a flowchart representative of a second example finite state machine that may be at least one of executed, instantiated, or performed using an example programmable circuitry implementation of the re-driver of FIG. 2 during enablement of the receiver circuitry of FIG. 2.

FIG. 9 is a flowchart representative of a second example finite state machine (FSM) 900 that may be at least one of executed, instantiated, or performed using an example programmable circuitry implementation of the re-driver 200 of FIG. 2 during enablement of the receiver circuitry $214_A$ of FIG. 2. In the example of FIG. 9, the FSM 900 corresponds to the second case for enablement of the receiver circuitry $214_A$ described above. The FSM 900 of FIG. 9 begins in state 902, at which the re-driver 200 is in a sleep mode of operation. For example, in state 902, the switch $304_A$ is open, the switch $304_B$ is open, the switch $304_C$ is open, and the switch $304_D$ is closed. Also, in state 902, the switches $304_F$, $304_G$, $304_H$, $304_I$, $304_J$, $304_K$ are in a trimmed state. In state 902, the receiver circuitry $214_A$ is disabled.

In the illustrated example of FIG. 9, the FSM 900 transitions from state 902 to state 904 responsive to (e.g., based on) the control circuitry 216 receiving a re-driver enable signal. In state 904, the switch $304_A$ is open, the switch $304_B$ is open, the switch $304_C$ is open, and the switch $304_D$ is closed. Also, in state 904, the switches $304_F$, $304_G$, $304_H$, $304_I$, $304_J$, $304_K$ are open (e.g., to increase an impedance of the shared termination network $210_A$). In state 904, the receiver circuitry $214_A$ is disabled.

In the illustrated example of FIG. 9, the FSM 900 transitions from state 904 to state 906 responsive to (e.g., based on) the control circuitry 216 changing the common mode voltage of the shared termination network $210_A$. For example, the FSM 900 transitions from state 904 to state 906 responsive to (e.g., based on) the control circuitry 216 closing the switch 304 and the switch $304_C$ and opening the switch $304_D$. In state 906, the switch $304_A$ is open, the switch $304_B$ is closed, the switch $304_C$ is closed, and the switch $304_D$ is open. Also, in state 906, the switches $304_F$, $304_G$, $304_H$, $304_I$, $304_J$, $304_K$ are open (e.g., to increase an impedance of the shared termination network $210_A$). In state 906, the receiver circuitry $214_A$ is enabled.

In the illustrated example of FIG. 9, the FSM 900 transitions from state 906 to state 908 responsive to (e.g., based on) the control circuitry 216 determining that a first threshold amount of time (e.g., 10-15 μs) has elapsed. In the example of FIG. 9, the first threshold amount of time corresponds to a threshold amount of time for the common mode voltage of the shared termination network $210_A$ to reach steady state. In state 908, the switch $304_A$ is open, the switch $304_B$ is closed, the switch $304_C$ is closed, and the switch $304_D$ is open. Also, in state 908, the switches $304_F$, $304_G$, $304_H$, $304_I$, $304_J$, $304_K$ are in a trimmed state. In state 908, the receiver circuitry $214_A$ is enabled.

In the illustrated example of FIG. 9, the FSM 900 transitions from state 908 to state 910 responsive to (e.g., based on) the control circuitry 216 determining that a second threshold amount of time (e.g., 30 μs) has elapsed. For example, the second threshold amount of time corresponds to a threshold amount of time for enablement of the receiver circuitry $214_A$ to be completed. In state 910, the switch $304_A$ is open, the switch $304_B$ is closed, the switch $304_C$ is closed, and the switch $304_D$ is open. Also, in state 910, the switches $304_F$, $304_G$, $304_H$, $304_I$, $304_J$, $304_K$ are in a trimmed state. In state 910, the receiver circuitry $214_A$ is in a high-speed mode of operation. In the example of FIG. 9, the FSM 900 transitions from state 910 to state 902 responsive to (e.g., based on) the control circuitry 216 receiving a re-driver disable signal.

Flowcharts representative of at least one of example machine-readable instructions, which may be executed by programmable circuitry to at least one of implement or instantiate the re-driver 200 of FIG. 2 or example operations which may be performed by programmable circuitry to at least one of implement or instantiate the re-driver 200 of FIG. 2, are shown in FIGS. 4, 5, 6, 7, 8, and 9. The machine-readable instructions may be at least one of (a) one or more executable programs or portion(s) of one or more executable programs for execution by programmable circuitry such as the programmable circuitry 1312 shown in the example programmable circuitry platform 1300 described below in connection with FIG. 13 or (b) one or more function(s) or portion(s) of functions to be performed by the example programmable circuitry (e.g., an FPGA). In some examples, the machine-readable instructions trigger an operation, a task, etc., to be at least one of carried out or performed in an automated manner in the real world. As used herein, "automated" means without human involvement.

The program may be embodied in instructions (e.g., at least one of software or firmware) stored on one or more non-transitory storage medium that is at least one of computer-readable or machine-readable such as at least one of cache memory, a magnetic-storage device or disk (e.g., a floppy disk, a Hard Disk Drive (HDD), etc.), an optical-storage device or disk (e.g., a Blu-ray disk, a Compact Disk (CD), a Digital Versatile Disk (DVD), etc.), a Redundant Array of Independent Disks (RAID), a register, ROM, a solid-state drive (SSD), SSD memory, non-volatile memory (e.g., electrically erasable programmable read-only memory (EEPROM), flash memory, etc.), volatile memory (e.g., Random Access Memory (RAM) of any type, etc.), or any other storage device or storage disk. The instructions of the at least one of non-transitory computer-readable or machine-readable medium may at least one of program or be executed by programmable circuitry located in one or more hardware devices, but at least one of the entire program or parts thereof could alternatively be one or more of (a) at least one of executed or instantiated by one or more hardware devices other than the programmable circuitry or (b) embodied in dedicated hardware. The machine-readable instructions may be at least one of distributed across multiple hardware devices or executed by two or more hardware devices (e.g., a server and a client hardware device). For example, the client hardware device may be implemented by an endpoint client hardware device (e.g., a hardware device associated with at least one of a human user or a machine user) or an intermediate client hardware device gateway (e.g., a radio access network (RAN)) that may facilitate communication between a server and an endpoint client hardware device. Similarly, the non-transitory computer-readable storage medium may include one or more mediums. Further, although the example program is described with reference to the flowchart(s) illustrated in FIGS. 4, 5, 6, 7, 8, and 9, many other methods of implementing the example re-driver 200 may alternatively be used. For example, at least one of (a) the order of execution of the blocks of the flowchart(s) may be changed, or (b) some of the blocks described may be changed, eliminated, or combined. Also or alternatively, any or all of the blocks of the flowchart(s) may be implemented by one or more hardware circuits (e.g., processor circuitry, discrete analog circuitry, integrated analog circuitry, discrete digital circuitry, integrated digital circuitry, an FPGA, an ASIC, a comparator, an operational-amplifier (op-amp), a logic circuit, etc.) structured to perform the corresponding operation without executing software or firmware. The programmable circuitry may be at least one of distributed in different network locations or local to one or more hardware devices (e.g., a single-core processor (e.g., a single core CPU), a multi-core processor (e.g., a multi-core CPU, an XPU, etc.)). For example, the programmable circuitry may be at least one of (a) one or more of a CPU or an FPGA located in the same package (e.g., the same integrated circuit (IC) package or in two or more separate housings), (b) one or more processors in a single machine, (c) multiple processors distributed across multiple servers of a server rack, (d) multiple processors distributed across one or more server racks, (e) etc., or (f) any combination(s) thereof.

The machine-readable instructions described herein may be stored in one or more of a compressed format, an encrypted format, a fragmented format, a compiled format, an executable format, a packaged format, etc. Machine-readable instructions as described herein may be stored as data (e.g., computer-readable data, machine-readable data, one or more bits (e.g., one or more computer-readable bits, one or more machine-readable bits, etc.), a bitstream (e.g., a computer-readable bitstream, a machine-readable bitstream, etc.), etc.) or a data structure (e.g., as portion(s) of instructions, code, representations of code, etc.) that may be utilized to at least one of create, manufacture, or produce machine-executable instructions. For example, the machine-readable instructions may be fragmented and stored on at least one of one or more storage devices, one or more disks or one or more computing devices (e.g., servers) located at the same or different locations of a network or collection of networks (e.g., in the cloud, in edge devices, etc.). The machine-readable instructions may require one or more of installation, modification, adaptation, updating, combining, supplementing, configuring, decryption, decompression, unpacking, distribution, reassignment, compilation, etc., in order to render them at least one of directly readable, directly interpretable, or directly executable by at least one of a computing device or other machine. For example, the machine-readable instructions may be stored in multiple parts, which are at least one of individually compressed, individually encrypted, or individually stored on separate computing devices, where the parts when at least one of decrypted, decompressed, or combined form a set of at least one of computer-executable or machine-executable instructions that implement at least one of one or more functions or one or more operations that may together form a program such as that described herein.

In another example, the machine-readable instructions may be stored in a state in which they may be read by programmable circuitry, but require addition of a library (e.g., a dynamic link library (DLL)), a software development kit (SDK), an application programming interface (API), etc., in order to execute the machine-readable instructions on a particular computing device or other device. In another example, the machine-readable instructions may need to be adjusted (e.g., settings stored, data input, network addresses recorded, etc.) before at least one of the machine-readable instructions or the corresponding program(s) can be executed in whole or in part. Thus, at least one of machine-readable, computer-readable, or machine-readable media, as used herein, may include at least one of instructions or program(s) regardless of the particular format or state of at least one of the machine-readable instructions or program(s).

The machine-readable instructions described herein can be represented by any past, present, or future instruction language, scripting language, programming language, etc. For example, the machine-readable instructions may be represented using any of the following languages: C, C++, Java, C Sharp, Perl, Python, JavaScript, HyperText Markup Language (HTML), Structured Query Language (SQL), Swift, etc.

As mentioned above, the example operations of FIGS. 4, 5, 6, 7, 8, and 9 may be implemented using executable instructions (e.g., at least one of computer-readable or machine-readable instructions) stored on at least one of (a) one or more non-transitory computer-readable media or (b) one or more machine-readable media. As used herein, at least one of the terms non-transitory computer-readable medium, non-transitory computer-readable storage medium, non-transitory machine-readable medium, or non-transitory machine-readable storage medium are expressly defined to include at least one of any type of computer-readable storage device or any type of computer-readable storage disk and to exclude propagating signals and to exclude transmission media. Examples of at least one of such non-transitory computer-readable medium, non-transitory computer-readable storage medium, non-transitory machine-readable medium, or non-transitory machine-readable storage medium include at least one of optical storage devices, magnetic storage devices, an HDD, a flash memory, a read-only memory (ROM), a CD, a DVD, a cache, a RAM of any type, a register, or any other storage device or storage disk in which information is stored for any duration (e.g., for extended time periods, permanently, for brief instances, for temporarily buffering, for caching of the information, etc.). As used herein, the terms "non-transitory computer-readable storage device" and "non-transitory machine-readable storage device" are defined to include any physical (at least one of mechanical, magnetic, or electrical) hardware to retain information for a time period, but to exclude propagating signals and to exclude transmission media. Examples of at least one of non-transitory computer-readable storage devices or non-transitory machine-readable storage devices include at least one of random-access memory of any type, read only memory of any type, solid state memory, flash memory, optical discs, magnetic disks, disk drives, or redundant array of independent disks (RAID) systems. As used herein, the term "device" refers to physical structure such as one or more of at least one of mechanical equipment or electrical equipment, hardware, or circuitry that may or may not be at least one of adjusted by computer-readable instructions, machine-readable instructions, etc., or manufactured to execute computer-readable instructions, machine-readable instructions, etc.

Figure 10:
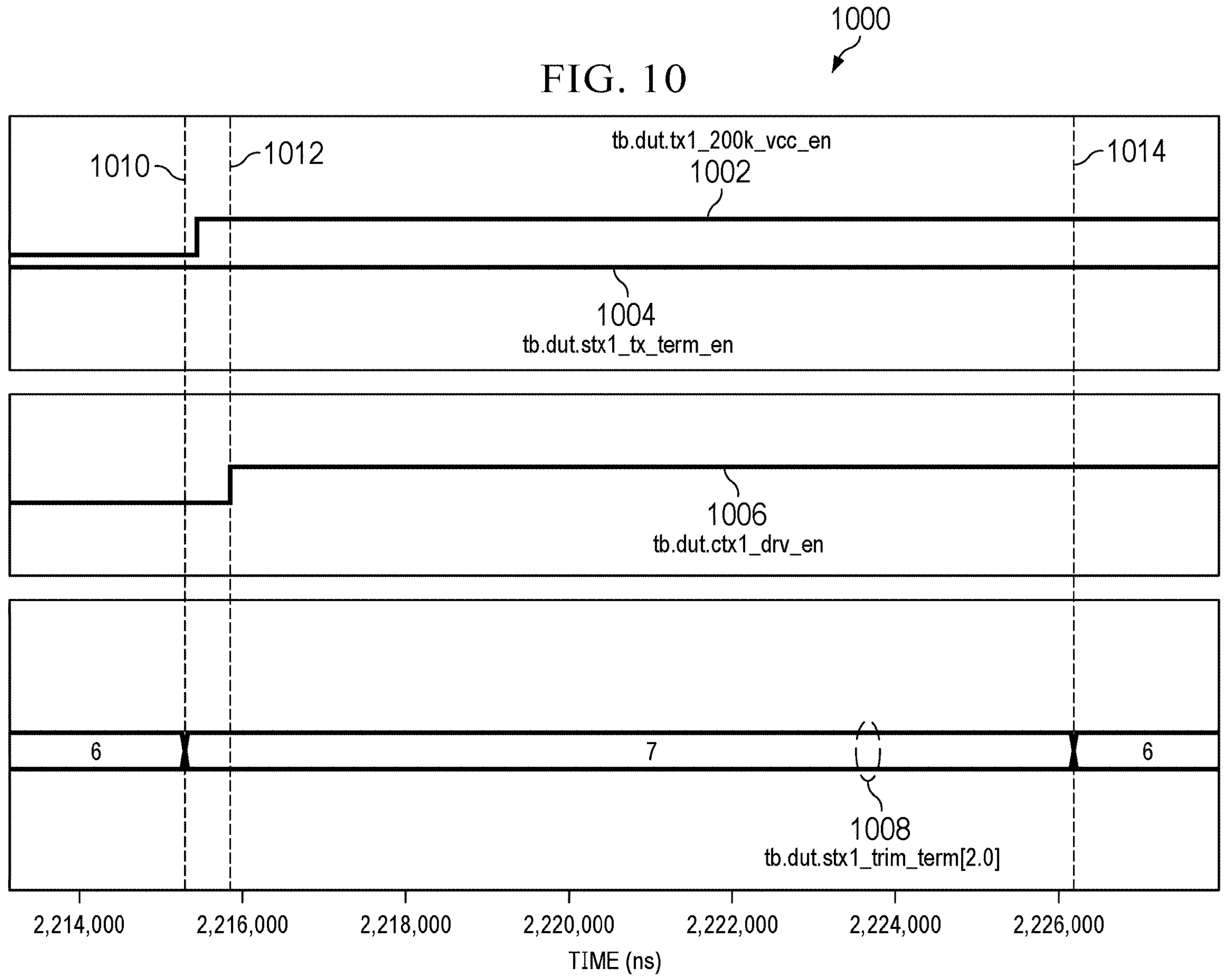
FIG. 10 is a timing diagram illustrating example operation of the re-driver of FIG. 2.

FIG. 10 is a timing diagram 1000 illustrating example operation of the re-driver 200 of FIG. 2. For example, the timing diagram 1000 illustrates the first case for enablement of the receiver circuitry 214$_{A}$ described above. In the example of FIG. 10, the timing diagram 1000 includes a first example plot 1002, a second example plot 1004, a third example plot 1006, and a fourth example plot 1008. For example, the plot 1002 is representative of the signal at the fourth output terminal of the control circuitry 216 and the plot 1004 is representative of the signal at the fifth output terminal of the control circuitry 216. Also, the plot 1006 is representative of at least one transmitter driver enable signal for the transmitter circuitry 212$_{B}$. In the example of FIG. 10, the plot 1008 is representative of the signals at the first output terminal, the second output terminal, and the third output terminal of the control circuitry 216.

In the illustrated example of FIG. 10, at an example first time 1010, the signal at the fourth output terminal of the control circuitry 216 is at a logic low value (e.g., a "0" 0 V, etc.) and the signal at the fifth output terminal of the control circuitry 216 is at a logic high value (e.g., a "1," 5 V, etc.). Therefore, at time 1010, the switch 304$_{A}$ is closed, the switch 304$_{B}$ is open, the switch 304$_{C}$ is open, and the switch 304$_{D}$ is closed. As such, at time 1010, the common mode voltage terminal (e.g., the second terminal of the resistor 302$_{A}$) of the shared termination network 210$_{A}$ is coupled to the ground terminal 314 (e.g., the common mode voltage is set to VSS). Also, at time 1010, the at least one transmitter driver enable signal for the transmitter circuitry 212; is at a logic low value (e.g., a "0," 0 V, etc.). As such, the transmitter circuitry 212$_{B}$ is disabled at time 1010.

In the illustrated example of FIG. 10, before time 1010, the decimal value of the signals at the first output terminal, the second output terminal, and the third output terminal of the control circuitry 216 is six (e.g., a trimmed state). For example, before time 1010, the signal at the first output terminal of the control circuitry 216 is at a logic high value (e.g., a "1," 5 V, etc.), the signal at the second output terminal of the control circuitry 216 is at a logic high value (e.g., a "1," 5 V, etc.), and the signal at the third output terminal of the control circuitry 216 is at a logic low value (e.g., a "0," 0 V, etc.). At time 1010, the decimal value of the signals at the first output terminal, the second output terminal, and the third output terminal of the control circuitry 216 transitions from six (e.g., 110) to seven (e.g., 111). For example, at time 1010, the signal at the first output terminal of the control circuitry 216 remains at a logic high value (e.g., a "1," 5 V, etc.), the signal at the second output terminal of the control circuitry 216 remains at a logic high value (e.g., a "1," 5 V, etc.), and the signal at the third output terminal of the control circuitry 216 transitions from a logic low value (e.g., a "0," 0 V, etc.) to a logic high value (e.g., a "5," 5 V, etc.).

In the illustrated example of FIG. 10, between time 1010 and an example second time 1012, the signal at the fourth output terminal of the control circuitry 216 transitions from a logic low value (e.g., a "0" 0 V, etc.) to a logic high value (e.g., a "1," 5 V, etc.) and the signal at the fifth output terminal of the control circuitry 216 remains at a logic high value (e.g., a "1," 5 V, etc.). Therefore, between time 1010 and time 1012, the switch 304$_A$ transitions from closed to open, the switch 304$_B$ transitions from open to closed, the switch 304$_C$ transitions from open to closed, and the switch 304$_D$ transitions from closed to open. As such, between time 1010 and time 1012, the common mode voltage terminal (e.g., the second terminal of the resistor 302$_A$) of the shared termination network 210$_A$ transitions from being coupled to the ground terminal 314 (e.g., VSS) to being coupled to the supply voltage terminal 312 (e.g., VCC).

Advantageously, by increasing the impedance of the shared termination network 210$_A$ before time 1010, the control circuitry 216 maintains compliance with USB 3 and USB 4. For example, despite at least one transient that may occur in the voltage at the common mode terminal (e.g., the second terminal of the resistor 302$_A$) of the shared termination network 210$_A$ during the change in the common mode voltage of the shared termination network 210$_A$, the common mode voltage of the re-driver 200 will remain within the limits set by USB 3 and USB 4 because the control circuitry 216 increased the impedance of the shared termination network 210$_A$. Also, by increasing the impedance of the shared termination network 210$_A$ before time 1010, the control circuitry 216 prevents the common mode voltage of a device at the far end of a transmission path including the re-driver 200 from varying outside the limits set by USB 3 and USB 4.

In the illustrated example of FIG. 10, at time 1012, the at least one transmitter driver enable signal for the transmitter circuitry 212; transitions from a logic low value (e.g., a "0," 0V, etc.) to a logic high value (e.g., a "1," 5 V, etc.). As such, the transmitter circuitry 212$_B$ transitions from being disabled to being enabled at time 1012. At an example third time 1014, the decimal value of the signals at the first output terminal, the second output terminal, and the third output terminal of the control circuitry 216 transitions from seven to six (e.g., a trimmed state). For example, at time 1014, the signal at the first output terminal of the control circuitry 216 remains at a logic high value (e.g., a "1," 5 V, etc.), the signal at the second output terminal of the control circuitry 216 remains at a logic high value (e.g., a "1," 5 V, etc.), and the signal at the third output terminal of the control circuitry 216 transitions from a logic high value (e.g., a "5," 5 V, etc.) to a logic low value (e.g., a "0," 0 V, etc.).

Figure 11:
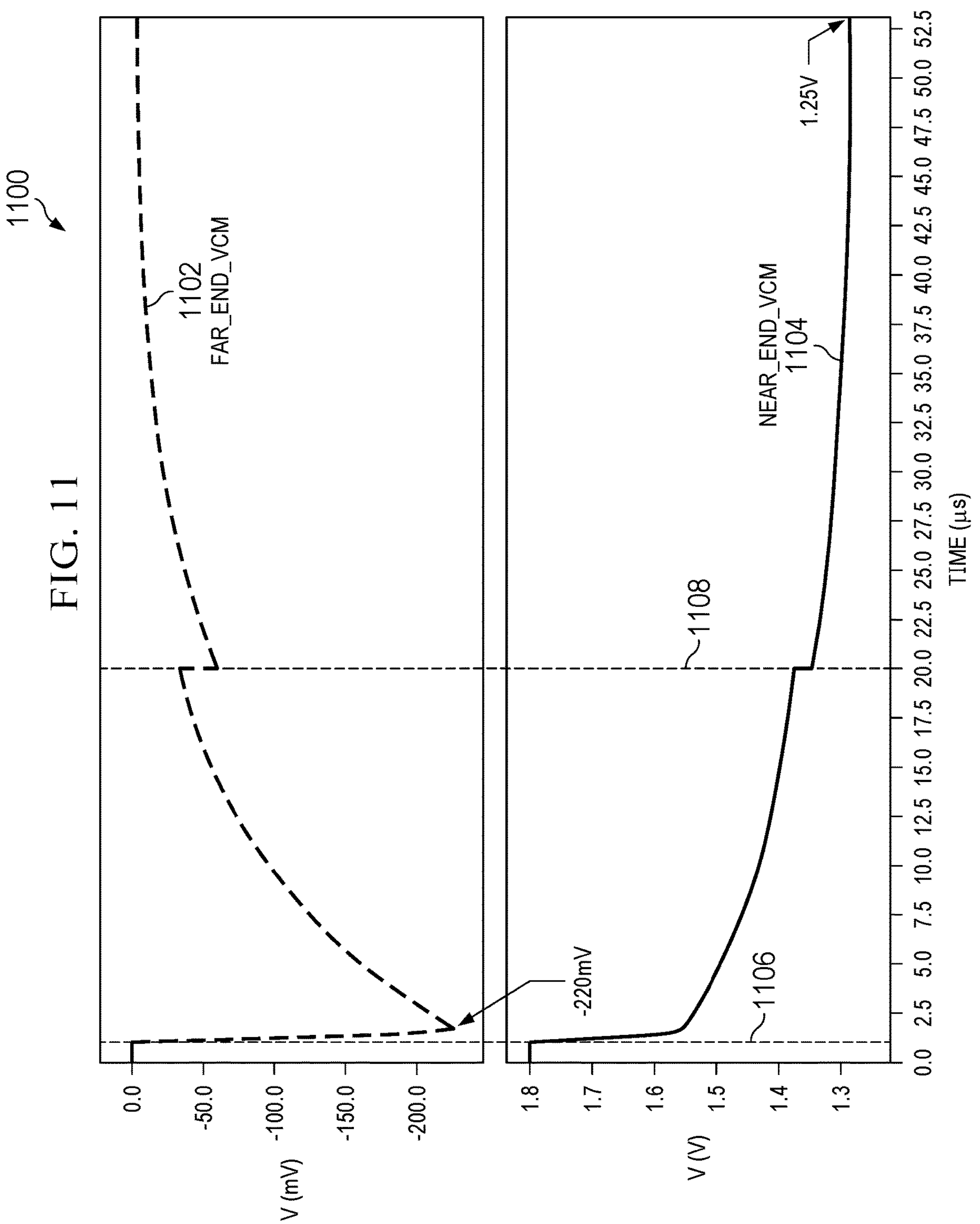
FIG. 11 is a first graphical illustration depicting changes in common mode voltage at the near end and the far end of a transmission path when utilizing the re-driver of FIG. 2.

FIG. 11 is a first graphical illustration 1100 depicting changes in common mode voltage at the near end and the far end of a transmission path when utilizing the re-driver 200 of FIG. 2. For example, the graphical illustration 1100 depicts changes in the common mode voltage at the near end and the far end of the transmission path during enablement of the transmitter circuitry 212$_A$. In the example of FIG. 11, the graphical illustration 1100 includes a first example plot 1102 representative of the common mode voltage of a device at the far end of the transmission path including the re-driver 200 and a second example plot 1104 representative of the common mode voltage of the re-driver 200 at the near end of the transmission path.

In the illustrated example of FIG. 11, the plot 1102 includes a horizontal axis (e.g., an x-axis) to measure time in μs. The plot 1102 also includes a vertical axis (e.g., a y-axis) to measure the common mode voltage of a device at the far end of the transmission path in mV. In the example of FIG. 11, the plot 1104 includes a horizontal axis (e.g., an x-axis) to measure time in μs. The plot 1104 also includes a vertical axis (e.g., a y-axis) to measure the common mode voltage of the re-driver 200 at the near end of the transmission path in V.

In the illustrated example of FIG. 11, before an example first time 1106 (e.g., 1 μs), the control circuitry 216 closes the switches 304$_F$, 304$_G$, 304$_H$, 304$_I$, 304$_J$, 304$_K$ to decrease the impedance of the shared termination network 210$_A$. At time 1106, the control circuitry 216 enables the transmitter circuitry 212$_A$ by closing at least one of the switch 304$_L$ or the switch 304$_M$ (e.g., via at least one transmitter driver enable signal). As such, at time 1106, the common mode voltage of the re-driver 200 at the near end of the transmission path begins to transition from VCC (e.g., 1.8 V) to an active value for the transmitter circuitry 212$_A$ (e.g., 1.25 V).

In the illustrated example of FIG. 11, the common mode voltage of a device at the far end of the transmission path experiences at least one transient at time 1106. For example, the common mode voltage of a device at the far end of the transmission path transitions from 0 V to about −223 mV over about 0.76 μs. Advantageously, by decreasing the impedance of the shared termination network 210$_A$ before enablement of the transmitter circuitry 212$_A$, the control circuitry 216 maintains compliance of the re-driver 200 with USB 3 and USB 4 despite at least one transient in the common mode voltage of the device at the far end of the transmission path. For example, the common mode voltage of the device at the far end of the transmission path does not decrease by more than 300 mV.

In the illustrated example of FIG. 11, at an example second time 1108 (e.g., 20 μs), the common mode voltage of the re-driver 200 at the near end of the transmission path is within a threshold of a steady state value (e.g., 1.25 V). As such, at time 1108, the control circuitry 216 returns the impedance of the shared termination network 210$_A$ to a steady state value (e.g., 42.5Ω) for nominal operation of the re-driver 200. For example, a threshold amount of time (e.g., 19 μs) after the control circuitry 216 enables the transmitter circuitry 212$_A$, the control circuitry 216 returns the impedance of the shared termination network 210$_A$ to a value for steady state operation (e.g., nominal operation) of the re-driver 200 that has been trimmed for PVT variations of the re-driver 200.

Figure 12:
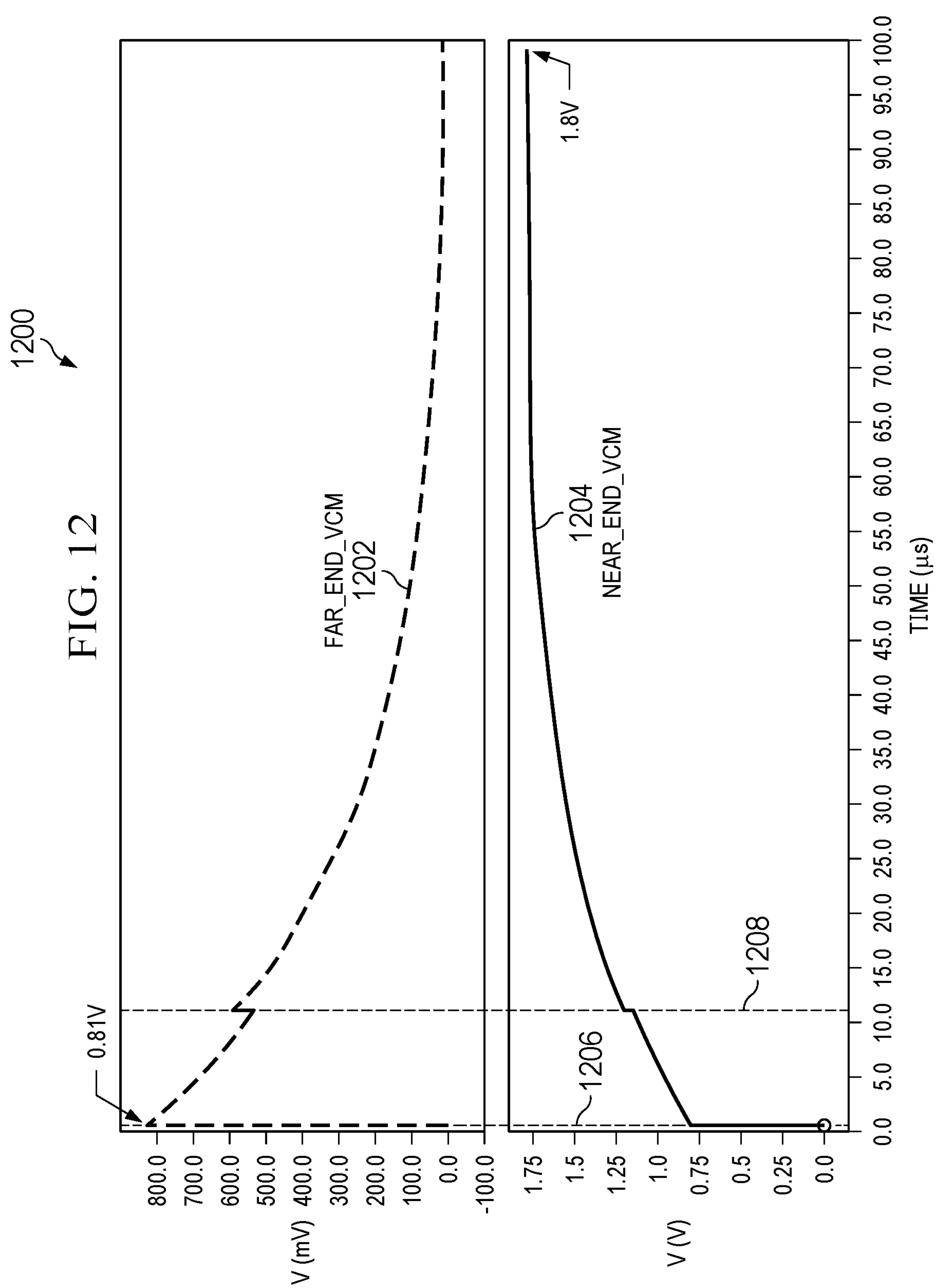
FIG. 12 is a second graphical illustration depicting changes in common mode voltage at the near end and the far end of a transmission path when utilizing the re-driver of FIG. 2.

FIG. 12 is a second graphical illustration 1200 depicting changes in common mode voltage at the near end and the far end of a transmission path when utilizing the re-driver 200 of FIG. 2. For example, the graphical illustration 1200 depicts changes in the common mode voltage at the near end and the far end of the transmission path during enablement of the receiver circuitry 214$_A$. In the example of FIG. 12, the graphical illustration 1200 includes a first example plot 1202 representative of the common mode voltage of a device at the far end of the transmission path including the re-driver 200 and a second example plot 1204 representative of the common mode voltage of the re-driver 200 at the near end of the transmission path.

In the illustrated example of FIG. 12, the plot 1202 includes a horizontal axis (e.g., an x-axis) to measure time in μs. The plot 1202 also includes a vertical axis (e.g., a y-axis) to measure the common mode voltage of a device at the far end of the transmission path in mV. In the example of FIG. 12, the plot 1204 includes a horizontal axis (e.g., an x-axis) to measure time in μs. The plot 1204 also includes a vertical axis (e.g., a y-axis) to measure the common mode voltage of the re-driver 200 at the near end of the transmission path in V.

In the illustrated example of FIG. 12, before an example first time 1206 (e.g., 0.75 μs), the control circuitry 216 opens the switches 304$_F$, 304$_G$, 304$_H$, 304$_I$, 304$_J$, 304$_K$ to increase the impedance of the shared termination network 210$_A$. At time 1206, the control circuitry 216 enables the receiver circuitry 214$_A$. For example, at time 1206, the control circuitry 216 enables the receiver circuitry 214$_A$ by at least one of (a) opening the switch 304$_A$ and the switch 304$_D$ and closing the switch 304$_B$ and the switch 304$_C$ or (b) opening the switch 304$_D$ and closing the switch 304$_B$ and the switch 304$_C$. As such, at time 1206, the common mode voltage of the re-driver 200 at the near end of the transmission path begins to transition from VSS (e.g., 0 V) to VCC (e.g., 1.8 V).

In the illustrated example of FIG. 12, the common mode voltage of a device at the far end of the transmission path experiences at least one transient at time 1206. For example, the common mode voltage of a device at the far end of the transmission path transitions from 0 V to about 0.81 V over about 0.73 μs. Advantageously, by increasing the impedance of the shared termination network 210$_A$ before enablement of the receiver circuitry 214$_A$, the control circuitry 216 maintains compliance of the re-driver 200 with USB 3 and USB 4 despite at least one transient in the common mode voltage of the device at the far end of the transmission path. For example, the common mode voltage of the device at the far end of the transmission path does not increase by more than 1 V.

In the illustrated example of FIG. 12, at an example second time 1208 (e.g., 11 μs), the common mode voltage of the re-driver 200 at the near end of the transmission path is within a threshold of a steady state value (e.g., 1.8 V). As such, at time 1208, the control circuitry 216 returns the impedance of the shared termination network 210$_A$ to a steady state value (e.g., 42.5Ω) for nominal operation of the re-driver 200. For example, a threshold amount of time (e.g., 10.25 μs) after the control circuitry 216 enables the receiver circuitry 214$_A$, the control circuitry 216 returns the impedance of the shared termination network 210$_A$ to a steady state value for nominal operation of the re-driver 200 that has been trimmed for PVT variations of the re-driver 200.

Figure 13:
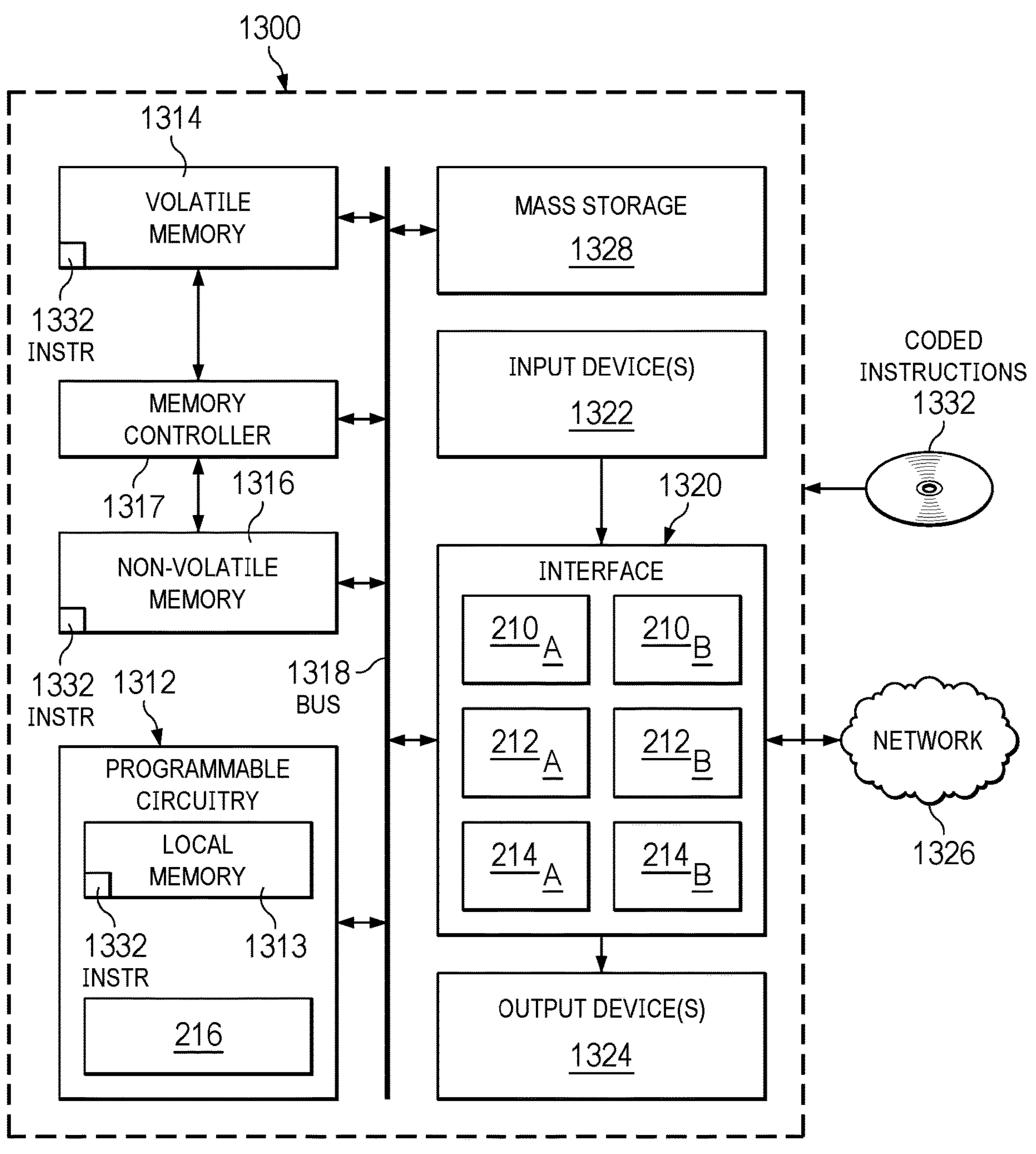
FIG. 13 is a block diagram of an example programmable circuitry platform including programmable circuitry structured to at least one of execute, instantiate, or perform the example machine-readable instructions or perform the example operations of FIGS. 4, 5, 6, 7, 8, and 9 to implement the re-driver of FIG. 2.

FIG. 13 is a block diagram of an example programmable circuitry platform 1300 structured to at least one of execute or instantiate at least one of the example machine-readable instructions or the example operations of FIGS. 4, 5, 6, 7, 8, and 9 to implement the re-driver 200 of FIG. 2. The programmable circuitry platform 1300 can be, for example, a re-driver, a re-timer, or at least one of any other type of computing device or any other type of electronic device.

The programmable circuitry platform 1300 of the illustrated example includes programmable circuitry 1312. The programmable circuitry 1312 of the illustrated example is hardware. For example, the programmable circuitry 1312 can be implemented by at least one of one or more integrated circuits, one or more logic circuits, one or more FPGAs, one or more microprocessors, one or more CPUs, one or more GPUs, one or more DSPs, or one or more microcontrollers from any desired family or manufacturer. The programmable circuitry 1312 may be implemented by one or more semiconductor based (e.g., silicon based) devices. In this example, the programmable circuitry 1312 implements the example control circuitry 216.

The programmable circuitry 1312 of the illustrated example includes a local memory 1313 (e.g., a cache, registers, etc.). The programmable circuitry 1312 of the illustrated example is in communication with main memory 1314, 1316, which includes a volatile memory 1314 and a non-volatile memory 1316, by a bus 1318. The volatile memory 1314 may be implemented by at least one of Synchronous Dynamic Random Access Memory (SDRAM), Dynamic Random Access Memory (DRAM), RAMBUS® Dynamic Random Access Memory (RDRAM®), or any other type of RAM device. The non-volatile memory 1316 may be implemented by flash memory or any other desired type of memory device. Access to the main memory 1314, 1316 of the illustrated example is controlled by a memory controller 1317. In some examples, the memory controller 1317 may be implemented by one or more integrated circuits, logic circuits, microcontrollers from any desired family or manufacturer, or any other type of circuitry to manage the flow of data going to and from the main memory 1314, 1316.

The programmable circuitry platform 1300 of the illustrated example also includes interface circuitry 1320. The interface circuitry 1320 may be implemented by hardware that complies with any type of interface standard, such as at least one of an Ethernet interface, a universal serial bus (USB) interface, a Bluetooth® interface, a near field communication (NFC) interface, a Peripheral Component Interconnect (PCI) interface, or a Peripheral Component Interconnect Express (PCIe) interface.

In the illustrated example, one or more input devices 1322 are connected to the interface circuitry 1320. The input device(s) 1322 permit(s) a user (e.g., a human user, a machine user, etc.) to enter at least one of data or commands into the programmable circuitry 1312. The input device(s) 1322 can be implemented by, for example, at least one of an audio sensor, a microphone, a camera (still or video), a keyboard, a button, a mouse, a touchscreen, a trackpad, a trackball, an isopoint device, or a voice recognition system.

One or more output devices 1324 are also connected to the interface circuitry 1320 of the illustrated example. The output device(s) 1324 can be implemented by, for example, at least one of display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, or a speaker. The interface circuitry 1320 of the illustrated example, thus, may include at least one of a graphics driver card, a graphics driver chip, or graphics processor circuitry such as a GPU.

The interface circuitry 1320 of the illustrated example also includes a communication device such as at least one of a transmitter, a receiver, a transceiver, a modem, a residential gateway, a wireless access point, or a network interface to facilitate exchange of data with external machines (e.g., computing devices of any kind) by a network 1326. The communication can be by, for example, an Ethernet connection, a digital subscriber line (DSL) connection, a telephone line connection, a coaxial cable system, a satellite system, a beyond-line-of-sight wireless system, a line-of-sight wireless system, a cellular telephone system, an optical connection, etc. In this example, the interface circuitry 1320 implements the example shared termination network $\mathbf{210}_A$, the example shared termination network $\mathbf{210}_B$, the example transmitter circuitry $\mathbf{212}_A$, the example transmitter circuitry $\mathbf{212}_B$, the example receiver circuitry $\mathbf{214}_A$, and the example receiver circuitry $\mathbf{214}_B$.

The programmable circuitry platform 1300 of the illustrated example also includes one or more mass storage discs or devices 1328 to store at least one of firmware, software, or data. Examples of such mass storage discs or devices 1328 include at least one of magnetic storage devices (e.g., floppy disk, drives, HDDs, etc.), optical storage devices (e.g., Blu-ray disks, CDs, DVDs, etc.), RAID systems, or solid-state storage discs or devices such as at least one of flash memory devices or SSDs.

The machine-readable instructions 1332, which may be implemented by the machine-readable instructions of FIGS. 4, 5, 6, 7, 8, and 9, may be at least one of stored in the mass storage device 1328, stored in the volatile memory 1314, stored in the non-volatile memory 1316, or stored on at least one non-transitory computer-readable storage medium such as a CD or DVD which may be removable.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, other elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended.

As used herein, singular references (e.g., "a," "an," "first," "second," etc.) do not exclude a plurality. The term "a" or "an" object, as used herein, refers to one or more of that object. The terms "a" (or "an"), "one or more," and "at least one" are used interchangeably herein. Furthermore, although individually listed, a plurality of means, elements, or actions may be implemented by, e.g., the same entity or object. Also, although individual features may be included in different examples or claims, these may possibly be combined, and the inclusion in different examples or claims does not imply that a combination of features is at least one of not feasible or not advantageous.

As used herein, connection references (e.g., attached, coupled, connected, and joined) may include at least one of intermediate members between the elements referenced by the connection reference or relative movement between those elements unless otherwise indicated. As such, connection references do not necessarily infer that two elements are at least one of directly connected or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of at least one of priority, physical order, arrangement in a list, or ordering in any way, but are merely used as at least one of labels or arbitrary names to distinguish elements for ease of understanding the described examples. In some examples, the descriptor "first" may be used to refer to an element in the detailed description, while the same element may be referred to in a claim with a different descriptor such as "second" or "third." In such instances, such descriptors are used merely for identifying those elements distinctly within the context of the discussion (e.g., within a claim) in which the elements might, for example, otherwise share a same name.

As used herein, the phrase "in communication," including variations thereof, encompasses at least one of direct communication or indirect communication through one or more intermediary components, and does not require at least one of direct physical (e.g., wired) communication or constant communication, but rather also includes selective communication at one or more of periodic intervals, scheduled intervals, aperiodic intervals, or one-time events.

As used herein, "programmable circuitry" is defined to include at least one of (i) one or more special purpose electrical circuits (e.g., an application specific circuit (ASIC)) structured to perform specific operation(s) and including one or more semiconductor-based logic devices (e.g., electrical hardware implemented by one or more transistors), or (ii) one or more general purpose semiconductor-based electrical circuits programmable with instructions to perform at least one of specific functions(s) or specific operation(s) and including one or more semiconductor-based logic devices (e.g., electrical hardware implemented by one or more transistors). Examples of programmable circuitry include at least one of programmable microprocessors such as Central Processor Units (CPUs) that may execute first instructions to perform at least one of one or more operations or one or more functions, Field Programmable Gate Arrays (FPGAs) that may be programmed with second instructions to trigger at least one of configuration or structuring of the FPGAs to instantiate at least one of one or more operations or one or more functions corresponding to the first instructions, Graphics Processor Units (GPUs) that may execute first instructions to perform at least one of one or more operations or one or more functions, Digital Signal Processors (DSPs) that may execute first instructions to perform at least one of one or more operations or one or more functions, XPUs, Network Processing Units (NPUs), one or more microcontrollers that may execute first instructions to perform at least one of one or more operations or one or more functions, or integrated circuits such as Application Specific Integrated Circuits (ASICs). For example, an XPU may be implemented by a heterogeneous computing system including multiple types of programmable circuitry (e.g., at least one of one or more FPGAs, one or more CPUs, one or more GPUs, one or more NPUs, one or more DSPs, etc., or any combination(s) thereof), and orchestration technology (e.g., application programming interface(s) (API(s)) that may assign computing task(s) to whichever one(s) of the multiple types of programmable circuitry is/are suited and available to perform the computing task(s).

As used herein, integrated circuit/circuitry is defined as one or more semiconductor packages containing one or more circuit elements such as transistors, capacitors, inductors, resistors, current paths, diodes, etc. For example, an integrated circuit may be implemented as one or more of an ASIC, an FPGA, a chip, a microchip, programmable circuitry, a semiconductor substrate coupling multiple circuit elements, a system on chip (SoC), etc.

As used herein, the phrase "at least one of A or B" (or "at least one of A and B") refers to implementations including any of: (a) at least one A; (b) at least one B; and (c) at least one A and at least one B.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Numerical identifiers such as "first," "second," "third," etc. are used merely to distinguish between elements of substantially the same type in terms of at least one of structure or function. These identifiers, as used in the detailed description, do not necessarily align with those used in the claims.

A device that is "configured to" perform a task or function may be at least one of (a) configured (e.g., at least one of programmed or hardwired) at a time of manufacturing by a manufacturer to perform the function or (b) configurable (or re-configurable) by a user after manufacturing to perform at least one of the function or other additional or alternative functions. The configuring may be through at least one of firmware or software programming of the device, through at least one of a construction or layout of hardware components and interconnections of the device, or a combination thereof.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device, or other electronics or semiconductor component.

A circuit or device that is described herein as including certain components may instead be adapted to be coupled to those components to form the described circuitry or device. For example, a structure described as including at least one of one or more semiconductor elements (such as transistors), one or more passive elements (such as at least one of resistors, capacitors, or inductors), or one or more sources (such as at least one of voltage sources or current sources) may instead include only the semiconductor elements within a single physical device (e.g., at least one of a semiconductor die or integrated circuit (IC) package) and may be adapted to be coupled to one or more of at least some of the passive elements or at least some of the sources to form the described structure either at a time of manufacture or after a time of manufacture, for example, by at least one of an end-user or a third-party.

Circuits described herein are reconfigurable to include the replaced components to provide functionality at least partially similar to functionality available prior to the component replacement. Components shown as resistors, unless otherwise stated, are generally representative of any one or more elements coupled at least one of in series or in parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other example embodiments, additional or fewer features may be incorporated into the integrated circuit. In addition, at least one of (a) some or all of the features illustrated as being external to the integrated circuit may be included in the integrated circuit or (b) some features illustrated as being internal to the integrated circuit may be incorporated outside of the integrated. As used herein, the term "integrated circuit" means one or more circuits that are at least one of: (i) incorporated in/over a semiconductor substrate; (ii) incorporated in a single semiconductor package; (iii) incorporated into the same module; or (iv) incorporated in/on the same printed circuit board.

Uses of the phrase "ground" in the foregoing description include at least one of a chassis ground, an Earth ground, a floating ground, a virtual ground, a digital ground, a common ground, or any other form of ground connection applicable to, or suitable for, the teachings of this description. As used herein, "about" modifies its subject/value to recognize the potential presence of variations that occur in real world applications. For example, "about" may modify dimensions that may not be exact due to at least one of manufacturing tolerances or other real-world imperfections. Unless otherwise stated, "about" preceding a value means +/−10 percent of the stated value, or, if the value is zero, a reasonable range of values around zero.

Modifications are possible in the described embodiments, and other embodiments are possible, within the scope of the claims.

From the foregoing, it will be appreciated that example systems, apparatus, articles of manufacture, and methods have been described that manage termination impedance in a re-driver. For example, described examples include a termination network that is shared between receiver circuitry and transmitter circuitry of a re-driver. As such, described examples reduce parasitic impedances that may be present on I/O terminals of the re-driver. Also, described examples control the common mode voltage of the shared termination network utilizing switches that are dual purpose. For example, described switches that control the impedance of the shared termination network during enablement of at least one of the receiver circuitry or the transmitter circuitry are also used to trim the impedance of the shared termination network for PVT variations. Accordingly, described examples reduce the hardware footprint to control the impedance of the shared termination network during enablement of at least one of the receiver circuitry or the transmitter circuitry. As such, examples described herein reduce the hardware footprint by using trim switches to control impedance during common mode excursions.

Also, described examples bias the common mode voltage of the shared termination network of a re-driver to VCC (e.g., 1.8 V). As such, level shifter circuitry for receiver circuitry of the re-driver can be implemented with one or more NPN BJTs. NPN-based level shifter circuitry operates more efficiently during high-speed operation of a re-driver than PNP-based level shifter circuitry. Described systems, apparatus, articles of manufacture, and methods improve the efficiency of using a computing device by reducing parasitic impedances at I/O terminals of a re-driver. For example, utilizing two distinct termination networks for receiver circuitry and transmitter circuitry of a re-driver can increase parasitic impedances at I/O terminals of the re-driver significantly as compared to utilizing a shared termination network between the receiver circuitry and the transmitter circuitry. As such, the high-speed performance of a re-driver utilizing two distinct termination networks for receiver circuitry and transmitter circuitry is degraded as compared to the high-speed performance of a re-driver utilizing a shared termination network between the receiver circuitry and the transmitter circuitry. Furthermore, examples described herein maintain compliance of a re-driver with USB 3 and USB 4 without degrading high-speed performance of the re-driver. Described systems, apparatus, articles of manufacture, and methods are accordingly directed to one or more improvement(s) in the operation of a machine such as a computer or at least one of other electronic device or mechanical device.

What is claimed is:

1. An apparatus comprising:

a first input/output (I/O) terminal and a second I/O terminal;

a first resistor having a first terminal coupled to the first I/O terminal and a second terminal coupled to at least one of a supply voltage terminal or a ground terminal;

a second resistor having a first terminal coupled to the second terminal of the first resistor and a second terminal coupled to the second I/O terminal;

a third resistor having a first terminal and a second terminal, the first terminal of the third resistor coupled to the first I/O terminal;

a first switch having a control terminal, a first terminal, and a second terminal, the first terminal of the first switch coupled to the second terminal of the first resistor, the second terminal of the first switch coupled to the second terminal of the third resistor;

a second switch having a control terminal, a first terminal, and a second terminal, the first terminal of the second switch coupled to the first terminal of the first switch and the second terminal of the first resistor;

a fourth resistor having a first terminal coupled to the second terminal of the second switch and a second terminal coupled to the second I/O terminal;

control circuitry having an output terminal coupled to the control terminal of the first switch and the control terminal of the second switch;

transmitter circuitry having a first output terminal coupled to the first I/O terminal and a second output terminal coupled to the second I/O terminal; and receiver circuitry having a first input terminal coupled to the first I/O terminal and a second input terminal coupled to the second I/O terminal.

2. The apparatus of claim 1, wherein the output terminal of the control circuitry is a first output terminal, the control circuitry has a second output terminal and a third output terminal, and the apparatus further includes:

a third switch having a control terminal, a first terminal, and a second terminal, the control terminal of the third switch coupled to the second output terminal of the control circuitry;

an exclusive OR gate having a first input terminal coupled to the second output terminal of the control circuitry, a second input terminal coupled to the third output terminal of the control circuitry, and an output terminal coupled to the first terminal of the third switch;

a fourth switch having a control terminal coupled to the second terminal of the third switch, a first terminal coupled to the ground terminal, and a second terminal coupled to the second terminal of the first resistor;

a fifth switch having a control terminal, a first terminal, and a second terminal, the first terminal of the fifth switch coupled to the supply voltage terminal, the second terminal of the fifth switch coupled to the second terminal of the first resistor; and a NOT AND gate having a first input terminal coupled to the second output terminal of the control circuitry, a second input terminal coupled to the third output terminal of the control circuitry, and an output terminal coupled to the control terminal of the fifth switch.

3. The apparatus of claim 1, wherein the output terminal of the control circuitry is a first output terminal, the control circuitry has a second output terminal, and the apparatus further includes:

a NOT gate having an input terminal and an output terminal, the input terminal of the NOT gate coupled to the second output terminal of the control circuitry;

a third switch having a control terminal, a first terminal, and a second terminal, the control terminal of the third switch coupled to the output terminal of the NOT gate, the first terminal of the third switch coupled to the supply voltage terminal;

a fourth switch having a control terminal, a first terminal, and a second terminal, the control terminal of the fourth switch coupled to the output terminal of the NOT gate, the first terminal of the fourth switch coupled to the ground terminal; and a fifth resistor having a first terminal coupled to the second terminal of the third switch and the second terminal of the fourth switch and a second terminal coupled to the second terminal of the first resistor.

4. The apparatus of claim 1, wherein the output terminal of the control circuitry is a first output terminal, the control circuitry has a second output terminal and a third output terminal, and the transmitter circuitry includes:

a first current source having a first terminal and a second terminal, the first terminal of the first current source coupled to the ground terminal;

a second current source having a first terminal and a second terminal, the first terminal of the second current source coupled to the ground terminal;

a third switch having a control terminal, a first terminal, and a second terminal, the control terminal of the third switch coupled to the second output terminal of the control circuitry, the first terminal of the third switch coupled to the second terminal of the first current source;

a fourth switch having a control terminal, a first terminal, and a second terminal, the control terminal of the fourth switch coupled to the third output terminal of the control circuitry, the first terminal of the fourth switch coupled to the second terminal of the second current source; and transmitter equalizer circuitry having a first driver terminal coupled to the second terminal of the third switch, a second driver terminal coupled to the second terminal of the fourth switch, a first output terminal coupled to the first I/O terminal, and a second output terminal coupled to the second I/O terminal.

5. An apparatus comprising:

a first input/output (I/O) terminal and a second I/O terminal;

a termination network having a first input terminal, a second input terminal, a third input terminal, a first output terminal, and a second output terminal, the first input terminal of the termination network coupled to the first I/O terminal, the second input terminal of the termination network coupled to the second I/O terminal;

transmitter circuitry having a first output terminal coupled to the first I/O terminal and a second output terminal coupled to the second I/O terminal;

receiver circuitry having a first input terminal coupled to the first output terminal of the termination network and a second input terminal coupled to the second output terminal of the termination network; and control circuitry having an output terminal coupled to the third input terminal of the termination network, the control circuitry to:

change an impedance of the termination network to a first value to compensate for at least one transient in a common mode voltage of the termination network; and based on the common mode voltage reaching a steady state value, change the impedance of the termination network to a second value for steady state operation.

6. The apparatus of claim 5, wherein the control circuitry is to change the common mode voltage of the termination network.

7. The apparatus of claim 5, wherein the control circuitry is to determine whether the common mode voltage has reached the steady state value based on a timer satisfying a threshold amount of time.

8. The apparatus of claim 5, wherein the first value is less than the second value, and the control circuitry is to:

close at least one switch of the termination network to decrease the impedance of the termination network to the first value to compensate for the at least one transient in the common mode voltage of the termination network during enable of the transmitter circuitry; and based on the common mode voltage reaching the steady state value, increase the impedance of the termination network to the second value.

9. The apparatus of claim 5, wherein the first value is greater than the second value, and the control circuitry is to:

open at least one switch of the termination network to increase the impedance of the termination network to the first value to compensate for the at least one transient in the common mode voltage of the termination network during enable of the receiver circuitry; and based on the common mode voltage reaching the steady state value, decrease the impedance of the termination network to the second value.

10. The apparatus of claim 5, wherein the transmitter circuitry includes an input terminal, the output terminal of the control circuitry is a first output terminal, the control circuitry includes a second output terminal coupled to the input terminal of the transmitter circuitry, and the control circuitry is to:

change a supply current for the transmitter circuitry to a third value to compensate for the at least one transient in the common mode voltage of the termination network; and based on the common mode voltage reaching an intermediate value different than the steady state value, change the supply current for the transmitter circuitry to a fourth value for steady state operation.

11. The apparatus of claim 10, wherein the third value is less than the fourth value, and the control circuitry is to decrease the supply current for the transmitter circuitry to the third value to compensate for the at least one transient in the common mode voltage of the termination network during enable of the transmitter circuitry.

12. The apparatus of claim 10, wherein the third value is less than the fourth value, and the control circuitry is to, based on the common mode voltage reaching the steady state value, increase the supply current for the transmitter circuitry to the fourth value.

13. A method comprising:

changing, with control circuitry, an impedance of a termination network of a re-driver to a first value to compensate for at least one transient in a common mode voltage of the termination network;

based on the common mode voltage reaching a steady state value, changing, with the control circuitry, the impedance of the termination network to a second value for steady state operation; and equalizing, with a transmitter circuitry, one or more signals at the re-driver.

14. The method of claim 13, further including changing the common mode voltage of the termination network.

15. The method of claim 13, further including determining whether the common mode voltage has reached the steady state value based on a timer satisfying a threshold amount of time.

16. The method of claim 13, wherein the first value is less than the second value, and the method further includes:

closing at least one switch of the termination network to decrease the impedance of the termination network to the first value to compensate for the at least one transient in the common mode voltage of the termination network during enable of transmitter circuitry of the re-driver; and based on the common mode voltage reaching the steady state value, increasing the impedance of the termination network to the second value.

17. The method of claim 13, wherein the first value is greater than the second value, and the method further includes:

opening at least one switch of the termination network to increase the impedance of the termination network to the first value to compensate for the at least one transient in the common mode voltage of the termination network during enable of receiver circuitry of the re-driver; and based on the common mode voltage reaching the steady state value, decreasing the impedance of the termination network to the second value.

18. The method of claim 13, further including:

changing a supply current for transmitter circuitry of the re-driver to a third value to compensate for the at least one transient in the common mode voltage of the termination network; and based on the common mode voltage reaching an intermediate value different than the steady state value, changing the supply current for the transmitter circuitry to a fourth value for steady state operation.

19. The method of claim 18, wherein the third value is less than the fourth value, and the method further includes decreasing the supply current for the transmitter circuitry to the third value to compensate for the at least one transient in the common mode voltage of the termination network during enable of the transmitter circuitry of the re-driver.

20. The method of claim 18, wherein the third value is less than the fourth value, and the method further includes, based on the common mode voltage reaching the steady state value, increasing the supply current for the transmitter circuitry to the fourth value.

21. A method comprising:

changing, with control circuitry, an impedance of a termination network of a re-driver to a first value to compensate for at least one transient in a common mode voltage of the termination network;

based on the common mode voltage reaching a steady state value, changing, with the control circuitry, the impedance of the termination network to a second value for steady state operation; and equalizing, with a receiver circuitry, one or more signals at the re-driver.

22. The method of claim 21, further including changing the common mode voltage of the termination network.

23. The method of claim 21, further including determining whether the common mode voltage has reached the steady state value based on a timer satisfying a threshold amount of time.

24. The method of claim 21, wherein the first value is less than the second value, and the method further includes:

closing at least one switch of the termination network to decrease the impedance of the termination network to the first value to compensate for the at least one transient in the common mode voltage of the termination network during enable of transmitter circuitry of the re-driver; and based on the common mode voltage reaching the steady state value, increasing the impedance of the termination network to the second value.

25. The method of claim 21, wherein the first value is greater than the second value, and the method further includes:

opening at least one switch of the termination network to increase the impedance of the termination network to the first value to compensate for the at least one transient in the common mode voltage of the termination network during enable of receiver circuitry of the re-driver; and based on the common mode voltage reaching the steady state value, decreasing the impedance of the termination network to the second value.

* * * * *